(12) United States Patent
Hoover

(10) Patent No.: US 11,380,295 B2
(45) Date of Patent: Jul. 5, 2022

(54) MULTI-TRANSDUCER SUSTAINER FOR STRINGED MUSICAL INSTRUMENTS

(71) Applicant: Alan Anderson Hoover, Indianapolis, IN (US)

(72) Inventor: Alan Anderson Hoover, Indianapolis, IN (US)

( * ) Notice: Subject to any disclaimer, the term of this patent is extended or adjusted under 35 U.S.C. 154(b) by 180 days.

(21) Appl. No.: 16/602,664

(22) Filed: Nov. 18, 2019

(65) Prior Publication Data

US 2021/0151022 A1    May 20, 2021

(51) Int. Cl.
*G10H 3/18* (2006.01)
*H03F 3/181* (2006.01)

(52) U.S. Cl.
CPC ............ *G10H 3/182* (2013.01); *G10H 3/181* (2013.01); *H03F 3/181* (2013.01); *G10H 2220/461* (2013.01); *H03F 2200/03* (2013.01)

(58) Field of Classification Search
CPC .. G10H 3/182; G10H 3/181; G10H 2220/461; H03F 3/181; H03F 2200/03
USPC ......................................................... 84/726
See application file for complete search history.

(56) References Cited

U.S. PATENT DOCUMENTS

| | | | | | |
|---|---|---|---|---|---|
| 4,236,433 A | * | 12/1980 | Holland | ................... | G10H 3/26 984/375 |
| 4,245,540 A | * | 1/1981 | Groupp | ................. | G10D 1/085 84/738 |
| 4,852,444 A | * | 8/1989 | Hoover | ..................... | G10H 3/26 84/738 |
| 4,941,388 A | * | 7/1990 | Hoover | ..................... | G10H 3/18 984/375 |
| 5,070,759 A | * | 12/1991 | Hoover | ..................... | G10H 3/26 84/DIG. 10 |
| 5,123,324 A | * | 6/1992 | Rose | ......................... | G10H 3/26 84/DIG. 10 |
| 5,200,569 A | * | 4/1993 | Moore | ....................... | G10H 3/26 84/723 |
| 5,523,526 A | * | 6/1996 | Shattil | ....................... | H05K 9/00 84/728 |
| 5,932,827 A | * | 8/1999 | Osborne | .................. | G10H 3/18 84/738 |
| 6,034,316 A | * | 3/2000 | Hoover | ..................... | G10H 3/26 84/738 |
| 6,947,564 B1 | * | 9/2005 | Hoover | ................... | H04S 1/002 381/1 |

(Continued)

*Primary Examiner* — Christina M Schreiber

(57) ABSTRACT

A sustaining device is described for prolonging the vibration of the strings of a stringed musical instrument, such as an electric guitar having two or three electromagnetic pickups. The pickups are all low impedance transducers that can function either as pickups or driver transducers, depending on whether they are connected to the input of the instrument pickup amplifier or to the output of the sustainer amplifier, respectively. When a transducer is being used as a sustainer driver, it cannot be simultaneously used as a pickup. Different methods of selecting transducers to function as pickups or drivers are described. The transducers, having only hundreds of wire turns instead of the usual thousands of turns for common pickups, have a flat audio frequency response that can be modified to produce a multitude of common pickup sounds by manipulating the transducer resonance frequency, bandwidth, and amplifier gain.

15 Claims, 25 Drawing Sheets

(56) References Cited

U.S. PATENT DOCUMENTS

Figure 1A:
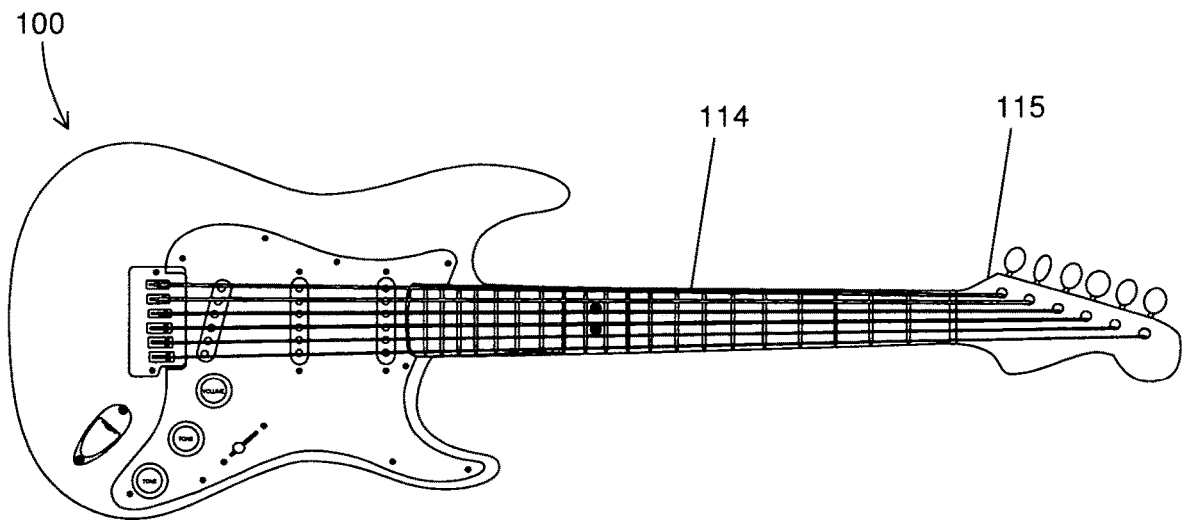
Figure 1A:
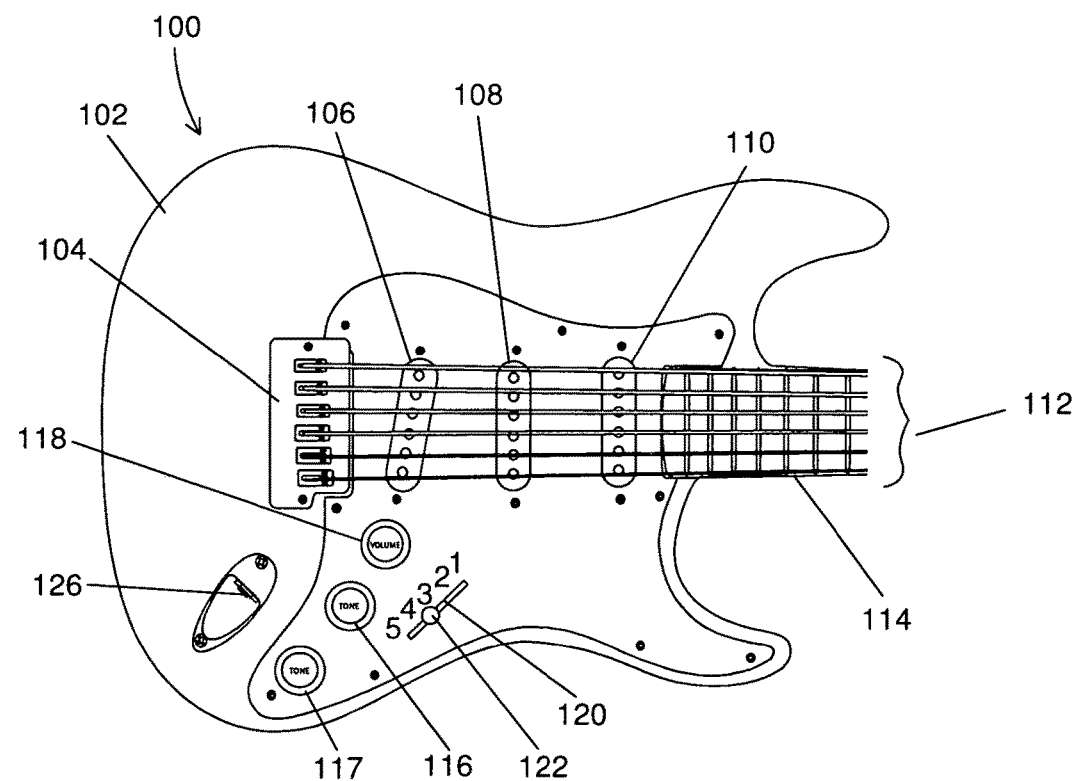

| | | | | |
|---|---|---|---|---|
| 2002/0069749 A1* | 6/2002 | Hoover | ............... | G10H 3/26 84/738 |
| 2005/0081703 A1* | 4/2005 | Hoover | ............... | G10H 3/26 84/726 |
| 2016/0217778 A1* | 7/2016 | Iermenko | ............... | G10H 3/186 |
| 2021/0151022 A1* | 5/2021 | Hoover | ............... | H03F 3/181 |

* cited by examiner

500 E

MULTI-TRANSDUCER SUSTAINER FOR STRINGED MUSICAL INSTRUMENTS

BACKGROUND OF THE INVENTION

The invention pertains to devices that produce infinite sustain of the string vibrations of electric stringed musical instruments such as guitar, mandolin and the like.

PRIOR ART

A low-voltage (approximately 9-20 volts) electromagnetic sustainer for electric musical instruments having vibratory elements such as strings, reeds, or the like is known to comprise the following components and characteristics:

One or more high impedance passive or active pickups (electromagnetic transducers) for sensing the vibrations of the vibrating elements of the musical instrument and producing an output electrical signal representative of the vibrations of the vibratory elements, wherein typical passive electromagnetic pickup coils have several thousand turns in order to produce an adequate output voltage.

A sustainer amplifier that amplifies the pickup signal;

A low-impedance electromagnetic driver transducer that accepts the amplified pickup signal at the sustainer amplifier output and provides a pulsating magnetic drive force in response to the amplified pickup signal, wherein the pulsating drive force impinges upon the vibratory elements which causes the vibration of the vibratory elements to be sustained. This is known as "feedback sustain".

For some sustainers on the market, the low-impedance electromagnetic driver transducer functions as an active pickup when the sustainer is turned off. A typical low-impedance electromagnetic driver transducer has several hundred turns of wire for each coil. The low impedance transducer allows the sustainer operate in a robust manner using commonly-available batteries such as the ubiquitous 9-volt battery.

The term "robust" in this context means that the sustainer performs in such a manner as to produce adequate sustained string vibration amplitude, and also that this sustained string vibration amplitude builds up quickly if the strings are lightly plucked or "finger-tapped". Most electromagnetic sustainers on the market have two or three operating modes. When the magnetic pulsations of the electromagnetic driver transducer are largely in phase with the string vibrations, the sustainer tends to produce sustained string vibrations that are in the fundamental vibration mode. If the sustainer amplifier phase is reversed, then the string vibrations will typically change from fundamental vibration to an upper harmonic, typically $2^{nd}$ through $5^{th}$. Instead of stopping the string vibrations, the pickup output phase tends to shift as string vibration frequency is increased. Different harmonic vibration modes can be forced by manipulating the phase response of the sustainer amplifier.

The musical instrument on which sustainers are most commonly used is a stringed musical instrument such as an electric guitar or mandolin, but most frequently the electric guitar. Such an instrument typically includes a plurality of strings and most often two or three pickups disposed in close proximity to the strings. The pickups sense the vibration of the instrument strings and produce an electrical output signal in response to the vibrations of the strings. On such instruments the strings are made of magnetically permeable steel. By far the most commonly used guitar pickup is the well-known electromagnetic pickup. When single or multiple pickup output signals are combined by one or more selector switches, numerous desirable sounds are produced when the output signals are sent to an electric guitar amplifier.

Guitar Types and Tones

Numerous brands and models of electric guitars and electromagnetic pickups (mostly known in the art simply as pickups) are popular with guitar players all over the world. Most electric guitars have either two or three electromagnetic pickups. The pickup design and placement on the guitar largely determine the different sounds that can be selected for a particular guitar model. Numerous brands and models of electromagnetic pickups are well known in the art and are available on the market. These pickups comprise mostly single-coil and dual coil hum-cancelling ("humbucking") construction. These are very popular with guitar players since the 1950's and 1960's, because they make it possible to achieve a variety of instrument tones. Many popular guitar models use either the single-coil or humbucking type of pickup, or a combination of both types.

Most electric guitars have either two or three pickups. For an instrument having three pickups, the pickup selector switch is most commonly a five-position lever-actuated rotary switch, such as the CRL switch that is commonly used with the Fender Stratocaster® guitar, manufactured by the Fender Musical Instrument Corporation, Scottsdale, Ariz. and similar guitars. For an instrument having two pickups, the pickup selector is most commonly a three-position lever-actuated rotary switch, such as the CRL switch that is commonly used with the Fender Telecaster® guitar and similar guitars, or optionally a three-position toggle switch such as is commonly used with the Gibson Les Paul® guitar, manufactured by Gibson Brands, Nashville Tenn. and similar guitars. Another (less common) method of pickup selection is to have individual SPST switches such as toggle or slide switches that select each pickup for instruments with either two or three pickups. Each pickup has its own switch. With this latter method of pickup selection for instruments having three pickups, any combination of the three pickups can be selected.

The single-coil type of pickup typically produces a very bright tone and is popular with many guitar players. FIG. 1 shows the well-known Fender Stratocaster® guitar 100. It is shown in front view in FIG. 1A and schematically in FIG. 1B. The Stratocaster is famous for its single-coil pickup sound. The most common Stratocaster has three single-coil pickups 106, 108, 110, disposed on the instrument body 102 at different locations under strings 112. Strings 112 are stretched along neck 114 between bridge 104 and headstock 115. The lower drawing of FIG. 1A shows mainly the guitar body because that is the focus of this description.

Figure 1B:
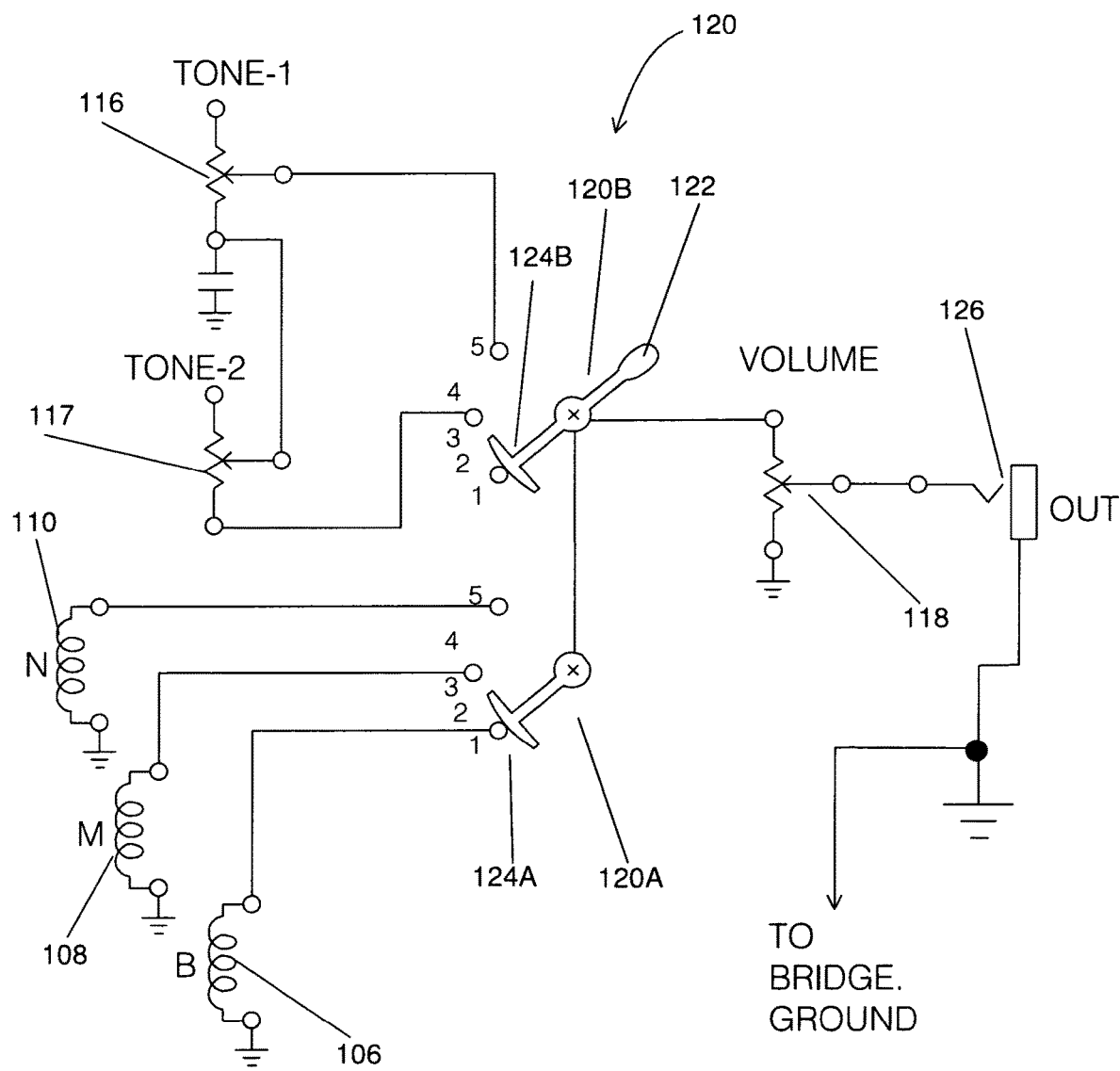

FIG. 1A and schematic FIG. 1B both show the guitar pickups 106, 108, 110, and also the Stratocaster electrical controls. Pickup selector switch 120 selects pickups 106, 108, and 110 individually and in combination, depending upon the switch position. Pickup selector switch 120 is a rotary-type switch, having a lever-type actuator 122.

The schematic of FIG. 1B shows that switch 120 has two separate sections 120A and 120B that operate simultaneously as lever 122 is actuated. Contactors 124A and 124B are electrically and mechanically connected together and move sequentially to the switch positions 1, 2, 3, 4, 5 of both the A and B switch sections. In position 1, bridge pickup 106 is selected by contactor 124A. The three pickups are similar in construction, and have identical frequency responses. The tone of bridge pickup 106 tends to be quite bright compared to the tones of middle pickup 108 and neck pickup 110 because of its close proximity to bridge 104. As the pickups are located further from bridge 104, the tone becomes less trebly because the string vibration amplitude is larger and has less high harmonic vibration amplitude as the distance from bridge 104 increases. The pickup signal is routed to volume control 118, and from there to output jack 126.

In position 2, both bridge pickup 106 and middle pickup 108 are selected by contactor 124A, and tone control 117 is selected by contactor 124B. When bridge pickup 106 and middle pickup 108 of the Stratocaster are selected in combination, a profound tone change occurs that is significantly different from either pickup selected singly. It is often referred to as a "quack" (or "quacky") tone, or sometimes "twangy" tone in musical publications and in conversation between Stratocaster aficionados, because of the distinctive tone that is made when the strings 112 are plucked. This sound has become very popular and is one of the reasons that so many people play this guitar. The sound occurs because of the positions of the two pickups 106, 108 in relation to bridge 104, and also to the individual pickup characteristics as both pickups having similar impedance load each other. The term "quack" apparently became popular because of the difficulty of expressing in language certain sights, sounds, tastes, feelings etc. If experienced Stratocaster players converse, there is little doubt that if the "quack" or "quacky" tone subject is brought up, both players will likely immediately know and understand this particular description characteristic of the sound that is being discussed. Also, this middle/bridge pickup combination is hum-canceling in modern Stratocasters because the middle pickup is reverse-wound and has reversed magnetic polarity.

In position 3, middle pickup 108 is selected. The tone of middle pickup 108 has less treble and more midrange than bridge pickup 106 because of the string vibration characteristics further from the bridge. Tone control 117 is selected. In position 4, middle pickup 108 and neck pickup 110 are both selected. Both tone controls 116 and 117 are in the circuit. The combination of middle pickup 108 and neck pickup 110 in position 4 produce another popular "quack" tone, but with a more full-bodied sound than the bridge/middle pickup combination. Also, this middle/neck pickup combination is hum-canceling in modern Stratocasters. Both tone controls 116 and 117 are in the circuit in position 4.

In position 5, neck pickup 110 only is selected, and tone control 116 is in the circuit. The neck pickup position of the Stratocaster produces another popular sound, particularly with blues guitarists and also some jazz guitarists. It has a fuller tone than either the bridge pickup or the middle pickup because of its position several inches from bridge 104.

The winding of an electromagnetic pickup for a stringed instrument has a very great impact on pickup tone and output level. Each additional turn increases the output voltage that is produced by the pickup in response to the string vibrations. As the coil turns are increased, the coil inductance and distributed winding capacitance also increase. The winding capacitance resonates with the winding inductance. The resonance frequency decreases as the turns increase because both the distributed capacitance and also winding inductance increase. A resonant peak is common in the 3-7 KHz range. The resonance frequency has a strong impact on the pickup sound. Most players have their favorite pickup sounds. These sounds are largely based on the resonance frequency of the pickup. The magnetic core type, shape and material used in the pickup also have an influence upon the pickup tone.

A large aftermarket for pickups has developed since the 1970's, incorporating different numbers of turns, and other options. Numerous pickup manufacturers worldwide now produce many models to choose from. Guitar players often experiment with different pickup models in order to find the sound that suits them best.

Figure 1C:
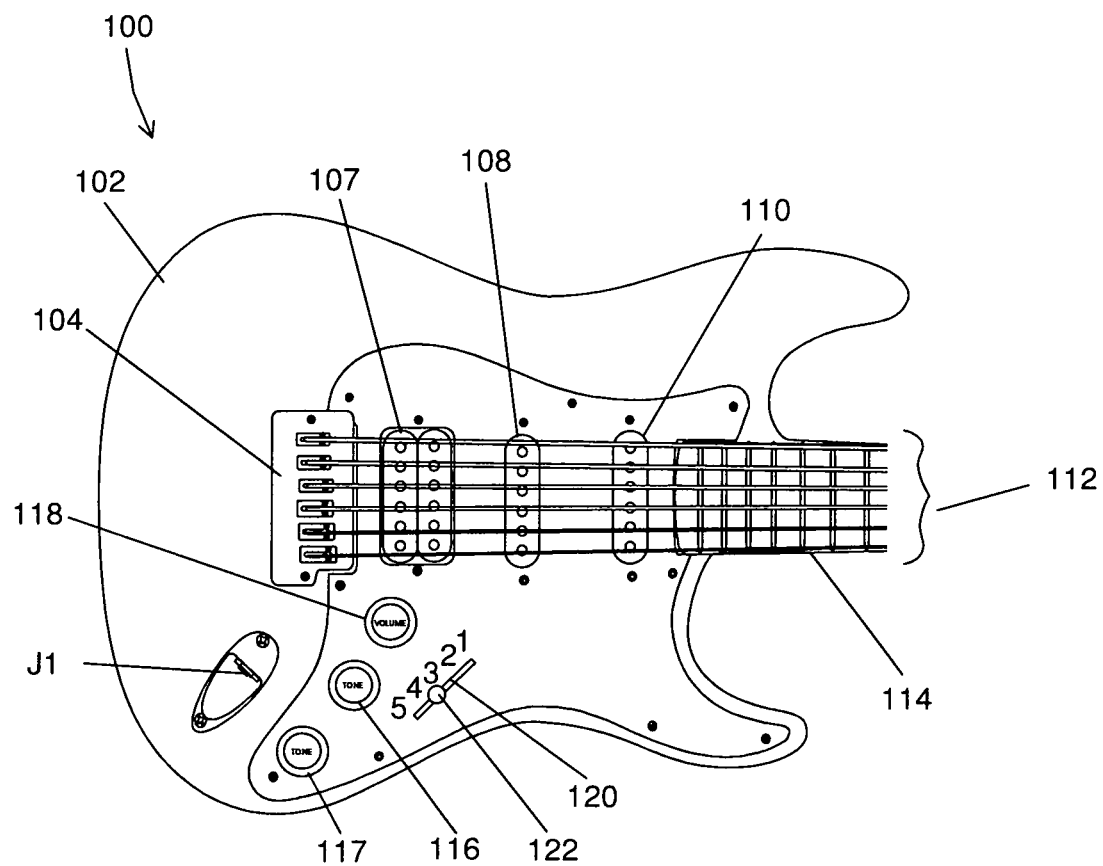

For rock music the bridge pickup is used often when soloing. Because of its position near the bridge, it has a brighter tone than other pickups disposed further from the bridge. Because of the bright tone, the sound can be better heard over the audio volume of the other band instruments. Some Stratocaster models replace single-coil bridge pickup 106 of FIG. 1A with a humbucker pickup 107 as shown in FIG. 1C. Since the 1980's, with the popularization of "heavy metal" rock music, many players started replacing the standard single-coil bridge pickup with humbuckers because the humbucker pickup tends to have less treble and more midrange than the single-coil. Humbucker pickups also tend to have higher output voltage than single-coil pickups. Several people are credited with inventing humbucker pickups starting in the 1930s. The most famous example is the so-called "PAF" (patent-applied-for, 1955) pickup used by Gibson guitars. U.S. Pat. No. 2,896,491 for this famous pickup was issued to Seth Lover of Gibson in 1959. It wasn't the first humbucking pickup but it is probably the most famous.

Figure 1D:
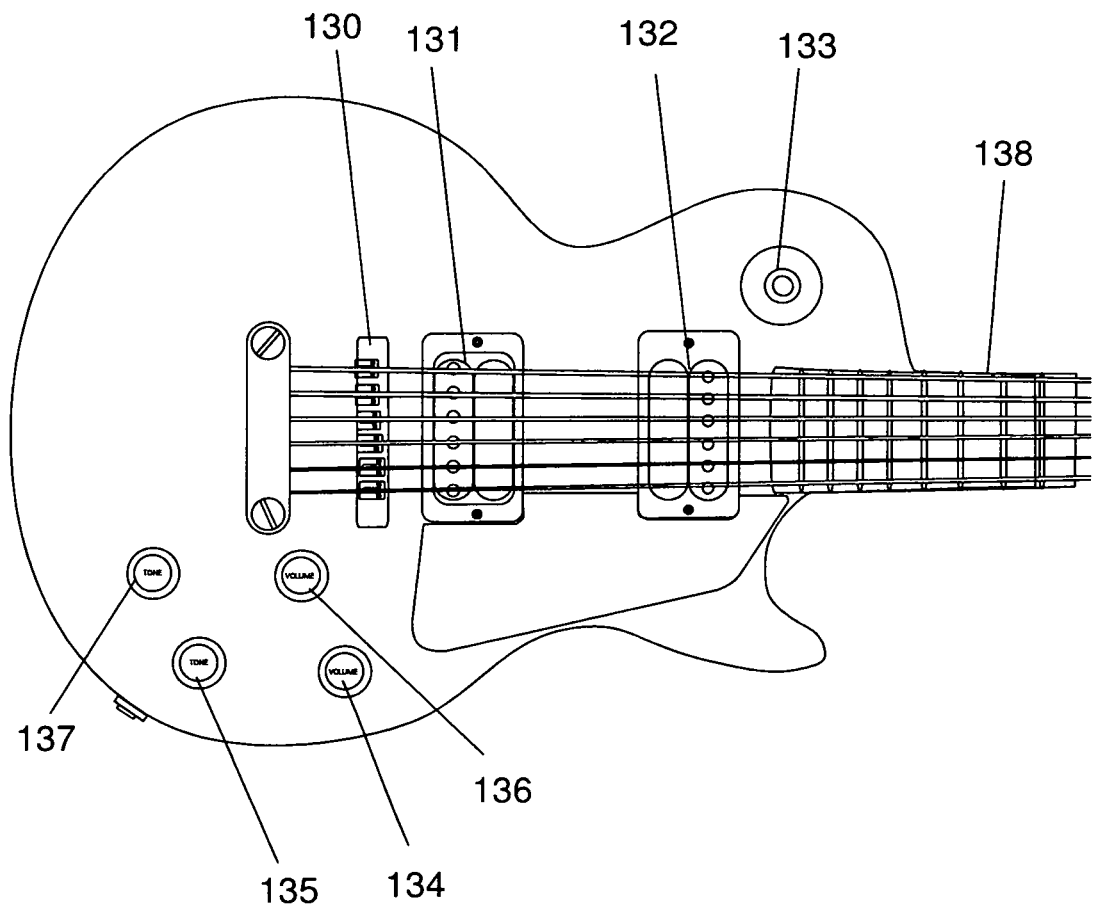
Figure 1E:
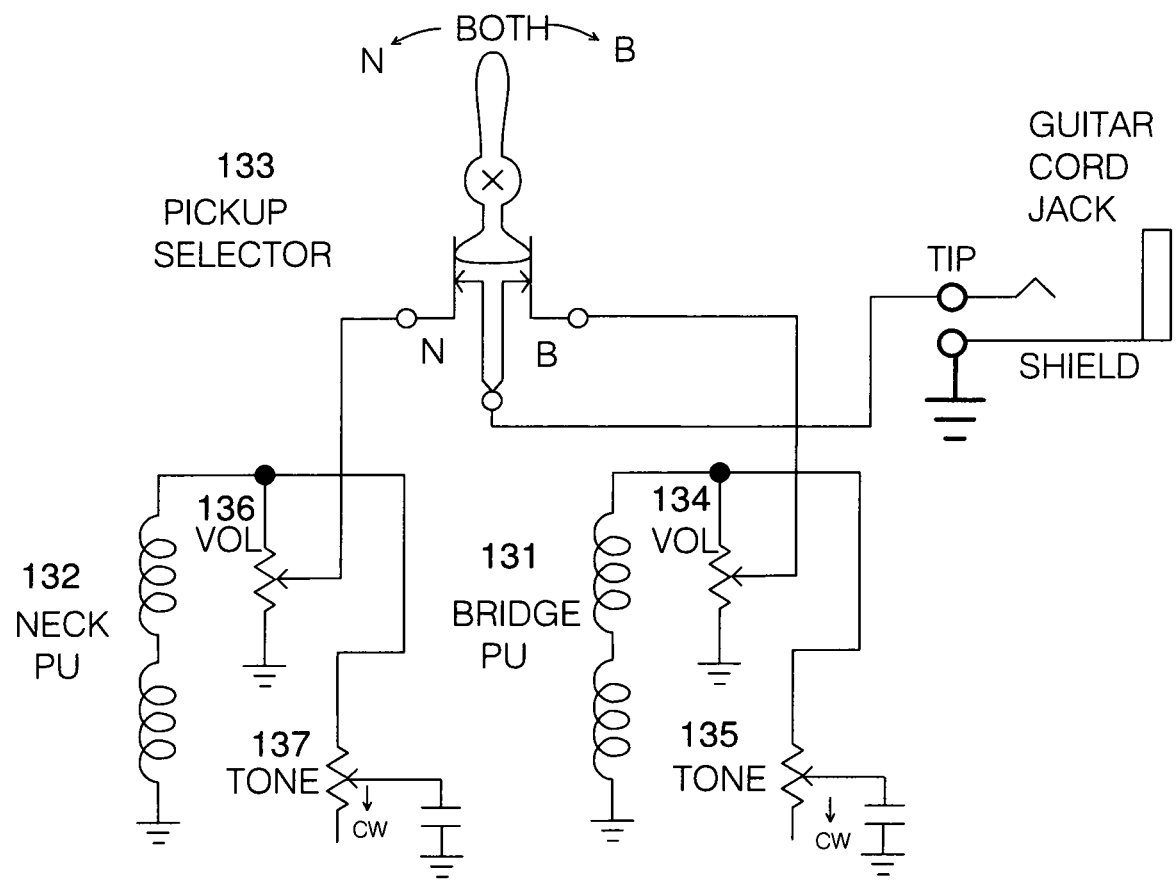

FIG. 1D shows a front view of another very popular electric guitar, the Gibson Les Paul model. FIG. 1E shows the electrical schematic of the pickups, controls, and output jack. This guitar has two humbucker pickups of the PAF design. Bridge pickup 131 is disposed next to the bridge 130 and neck pickup 132 next to the neck 138. The pickups are selected individually or blended in parallel connection by 3-position toggle selector 133. This produces three popular pickup sounds. Volume control 134 adjusts the volume of bridge pickup 131. Tone control 135 adjusts the tone of bridge pickup 131. Volume control 136 adjusts the volume of neck pickup 132. Tone control 137 adjusts the tone of neck pickup 132.

As with single-coil pickups, humbucker pickups that are placed near the bridge will have a brighter sound than those placed near the neck. As described previously, humbucker pickups have a frequency response that is less trebly than single-coil pickups. The three pickup sounds of the Gibson Les Paul are noticeably different from the five pickup sounds of the Fender Stratocaster. To most experienced players and listeners, the sound differences are easily discerned and recognized. The Stratocaster and Les Paul models have what are often referred to as two of the most distinctive and recognizable electric guitar sound selections. These two guitar models have largely defined the modern electric guitar. Many other brands and models of electric guitar are presently in production and enjoy widespread popularity. Many modernized body styles have been created, along with myriad paint colors and designs, mechanical tuning systems and many other enhancements, refinements and improvements. But most of these numerous newer guitar models and brands still use humbucker and single-coil pickups in similar combinations as the Stratocaster and Les Paul guitars. Many models of both humbucker and single-coil pickups are manufactured to provide variety in sound. The pickup varieties are more numerous than ever before. Most of the differences are based on the number of turns.

Pickup Output Frequency Response

Many musicians, notably "heavy-metal-rock" guitar players, prefer to have high output voltage from the pickups. This is usually desired in order to cause electric stringed-instrument electric guitar amplifiers to be "overdriven", wherein the amplifier is forced into a state where the internal amplifiers are driven into a "clipping" state. This means that the dynamic range of the amplifier has been limited by the power supply voltage. When this happens, the linear excursion range of the amplifier is exceeded. The amplifier output signal is rather severely distorted in the clipping state. Even though this might seem to be a condition that is to be avoided, this very overdriven condition often produces desirable ("dirty") sounds to the listener for certain types of music. Also, the notes actually sustain longer because as the amplifier input signal amplitude starts to decrease instantaneously after the initial plucking of a string, the output peak signal amplitude remains constant during the time the amplifier is in the clipping state.

As described earlier, as more pickup coil turns are added, the output level increases. Such highly-wound pickups have a frequency response that becomes less bright (lacking in treble) as more turns are added. This is because as each turn of wire is added to the coil, winding capacitance and inductance increase. The increased capacitance and inductance cause a resonance frequency peak that gets lower as turns are added. High output is desired by many players. But the resulting loss of brightness that accompanies high output level is often considered undesirable. The loss of brightness is often described as a "muddy" sound.

A popular arrangement with humbucking pickups is to provide access to the start and finish of both pickup coils so that switches can be used to customize the pickup wiring. The most popular arrangement is the use of the "coil-tap" switch. Typical humbucker pickup coil wiring has the two coils wired in series for maximum output voltage. If the junction of the two coils is shorted to ground by a switch, the pickup output voltage drops by approximately 6 dB and the remaining single-coil pickup frequency response has more treble than the original series connection. The coil-tap arrangement is often realized by using an instrument control potentiometer (such as volume or tone) with a push-pull switch attached. These are well-known in the art. This gives the musician more flexibility to choose tonal variations, which is desirable. Of course, when a humbucker pickup is coil-tapped, the resulting single-coil has lost the desirable hum-cancelling property.

Active Pickups

Active pickups have come to popularity more recently than passive pickups. Active pickups tend to have many less turns than passive pickups. This causes the coil output voltage to be small, but the resonance frequency can be much higher than for passive pickups. In fact, the resonance can be chosen to be beyond the highest frequency of normal human hearing. This produces a frequency response that is essentially flat across the frequency range of human hearing. The coil output signal is then amplified, which increases the output level to a more desirable volume. In fact, active pickups can be made that have the output level comparable to that of highly-wound passive pickup, but without the resulting "muddy" sound. Active pickups typically have high output and a bright sound that is rich in treble frequencies.

Sustainer Prior Art

Figure 2A:
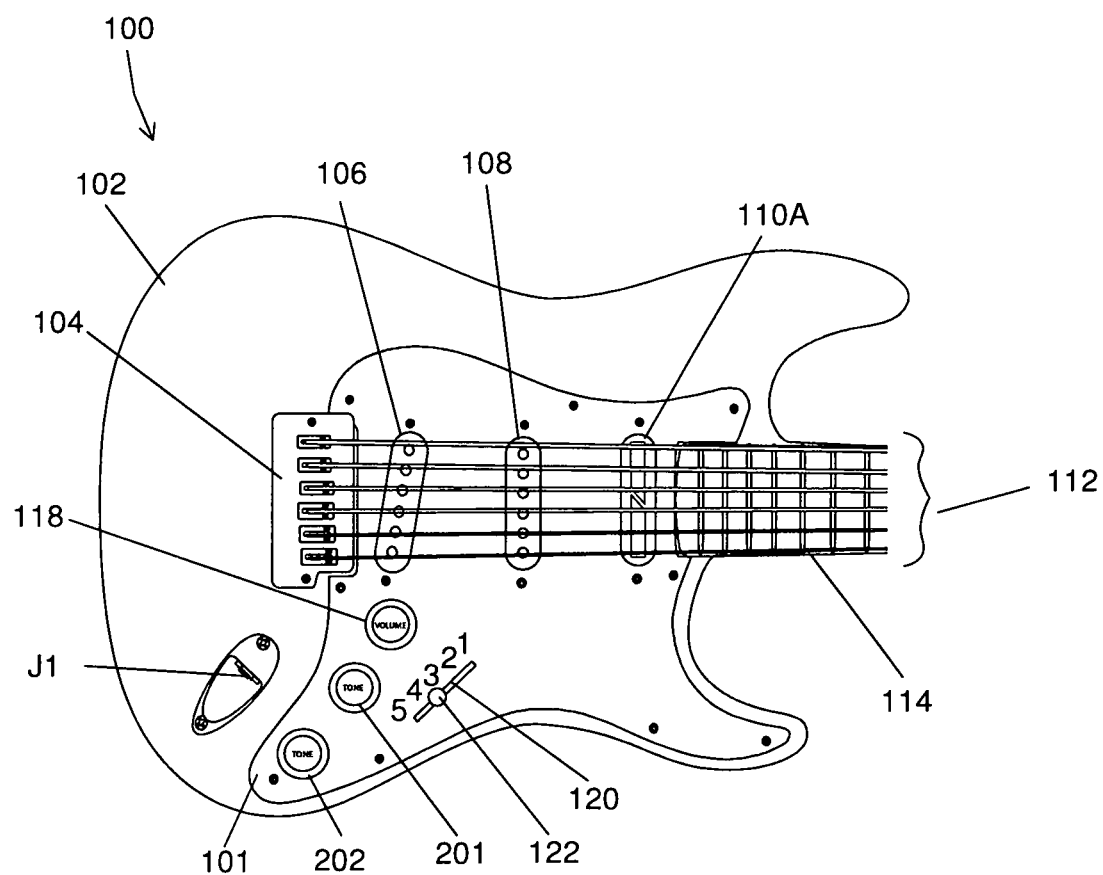

FIG. 2A shows a front view of the Fender Stratocaster guitar body 100 with a Sustainiac® Stealth Plus model electromagnetic sustainer installed. This sustainer model was manufactured from 2001 through 2007 by Maniac Music Inc., Indianapolis, Ind. This drawing is identical to FIG. 1A with one exception: Neck pickup 110 has been replaced by low impedance electromagnetic sustainer driver transducer 110A.

Figure 2B:
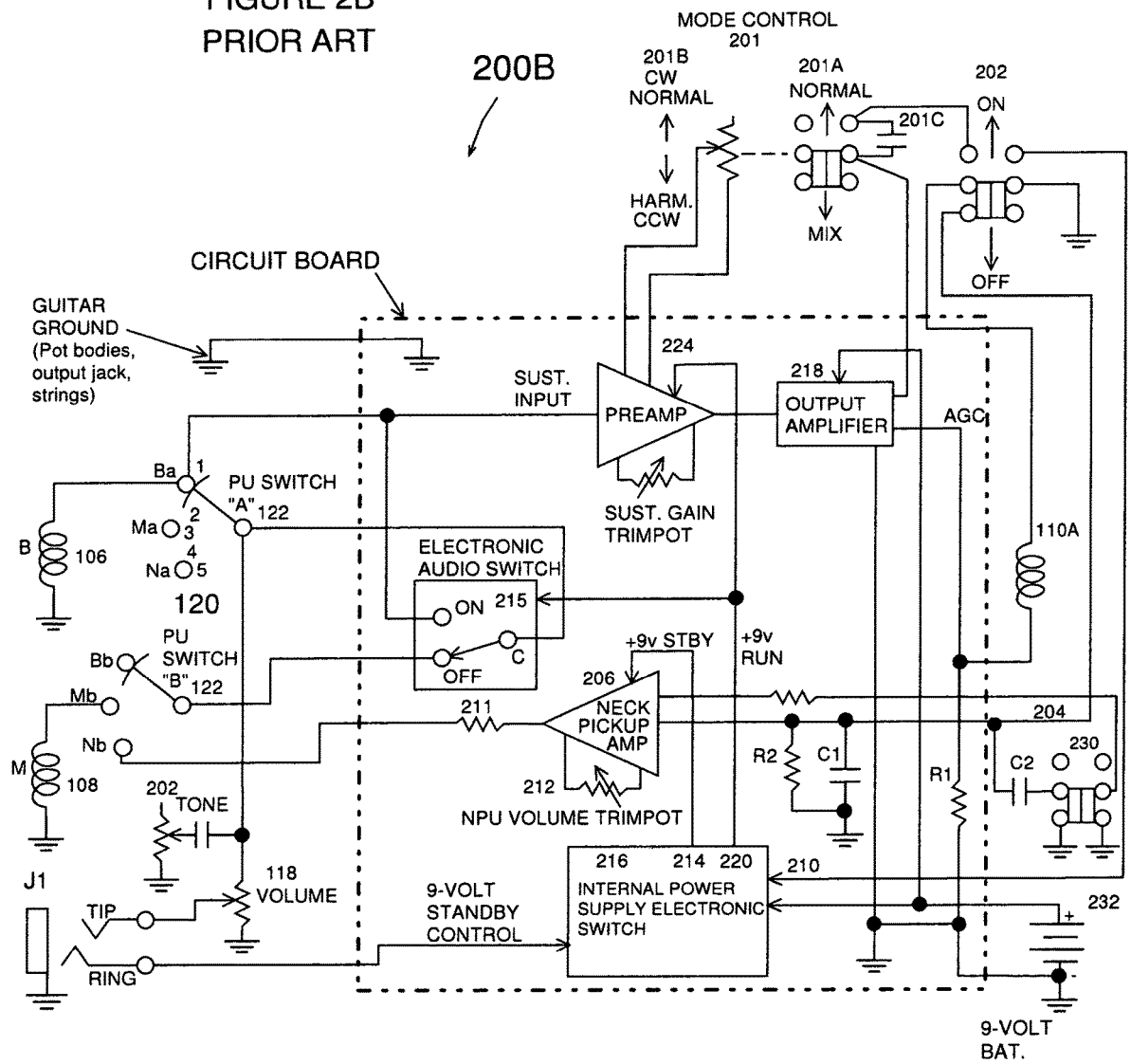

FIG. 2B shows an electrical schematic and block diagram of the controls of a Stratocaster guitar and also installed Sustainiac Stealth Plus electromagnetic sustainer 200B. This sustainer evolved from earlier designs as described in U.S. Pat. Nos. 4,941,388, 5,070,759, 5,932,827, and 6,034,316. Transducer 110A replaces guitar neck pickup 110 in a typical sustainer installation. The bilateral design of transducer 110A is based on the '759 patent. It is a low impedance electromagnetic transducer, having several hundred turns of wire in each of 2 coils that are placed in a side-by-side arrangement Typical electromagnetic instrument pickups are high impedance devices having several thousands of coil turns. Transducer 110A functions as an active neck pickup when sustainer 200B is turned off. The electronic circuit of sustainer 200B is located underneath pickguard 101 in the guitar control cavity and is therefore hidden from view in front view FIG. 2A but is shown in FIG. 2B. For FIG. 2A, tone control 202 is a potentiometer with built-in push-pull switch capability. It replaces the original tone control potentiometer 117. Or optionally ON-OFF switch 202 could be a toggle or other type switch. Likewise, sustainer mode control push-pull switch 201A is part of mode control 201, or a 3-position ON-OFF-ON toggle DPDT switch or other type DPDT switch can be wired to provide the same function.

Sustainer circuit 200B of FIG. 2B is placed into a standby state when a standard monaural ¼ inch guitar plug is inserted into guitar output jack J1 and sustainer ON-OFF switch 202 is in the OFF position. This same arrangement is shown in all of the FIG. 2 drawings. The ring terminal of J1 is connected to ground, which activates power supply electronic switch 216. A PNP transistor (not shown) is used as a saturated switch. The emitter of the transistor is connected to the positive terminal of a 9-volt battery or other electronic power supply. The collector of this transistor functions as the +9 v standby supply when the transistor is switched on. The base terminal is connected to one terminal of a resistor having approximately 47K ohms. When the other terminal of the resistor is connected to ground through the ring terminal of J1, the PNP transistor is in saturation, supplying current to all circuits connected to the +9 v standby supply. The total standby current is typically 2-3 milliamperes.

In this standby mode, sustainer driver transducer 110A functions as an active neck pickup as its output signal passes through ON-OFF switch 202A to the input of neck pickup amplifier 206. Resistor R2 and capacitor C1 are placed in parallel with transducer 110A when ON-OFF switch 202A is in the OFF position. Switch 202A can be a push-pull potentiometer that doubles as volume control 116, or tone control 117, or it can be a toggle switch or other type. Capacitor C1 lowers the resonance frequency of transducer 110A so that it is in the audio range. This makes it sound like a conventional passive pickup. Resistor R2 dampens the resonance to increase the resonance bandwidth for pickup sound character. Resistor R2 is preferably less than about 1000 ohms. Capacitor C1 can be in the range of 0.47 uF to 2 uF to produce a bright pickup sound that is similar to the single coil pickups of the Fender Stratocaster, or increased to 2-5 uF to produce a deeper humbucker sound similar to the Gibson PAF pickup sound. Circuit details of pickup amplifier 206 are not shown here, but it is a simple 2-transistor amplifier having negative feedback for low distortion.

Electronic audio switch 215 is placed in the OFF position when ON/OFF switch 202A is in the OFF position. This electrically connects sections A and B of pickup selector 120 together. This enables pickup selector 120 to function the same as for that shown in FIGS. 1A and 1B. Bridge pickup 106, middle pickup 108, and transducer 110A can be selected singly or in combination by pickup switch 120. When sustainer 200A is switched to the on state by ON-OFF switch 202A, electronic switch 215 is placed in the ON position. Because of this, bridge pickup 106 is automatically selected, regardless of the position of pickup selector switch 120. This is because section B of pickup selector 120 is disconnected from section A by electronic switch 215 and bridge pickup is connected to the top of volume control 116. This causes powered-on sustainer 200A to receive only the bridge pickup signal regardless of the lever position of selector 120. Because bridge pickup 106 is the most distant pickup from transducer 110A, the sustainer amplifier gain can be set to a high value to provide robust sustainer performance with small likelihood of oscillation caused by excessive magnetic crosstalk from transducer 110A to bridge pickup 106. If middle pickup 108 is allowed to be selected when sustainer 200 is on, sustainer gain has to be reduced to prevent oscillation due to excessive magnetic crosstalk from transducer 110A. Alternatively, electronic switch 215 can be replaced by a $3^{rd}$ section of ON/OFF switch 202A.

When sustainer ON-OFF switch 202A is placed in the ON position, sustainer circuit 200B is placed in the ON state. Conductor 210 is connected to ground, which activates +9 volt RUN supply 220 and sustainer preamplifier 224. The simple circuitry to accomplish this is not shown but has been used in the Sustainiac Stealth Plus sustainer since its introduction in year 2000 and also subsequent Sustainiac Stealth Pro sustainer, introduced in 2008. Transducer 110A is disconnected from input 204 of neck pickup amplifier 206 and connected to the output of sustainer amplifier 218 through mode control switch 201A, or alternatively through mix mode capacitor 201C, depending on the position of mode switch 201A. The three operating modes (Normal, Mix, and Harmonic) are accomplished by Mode Control push-pull pot 201, or can alternatively be accomplished by 3-position toggle with ON-OFF-ON switching characteristic (not shown in FIG. 200A or 200B). This mode switching arrangement has also been available since 2000.

Push-pull mode control 201 comprises push-pull switch 201A and potentiometer 201B. Switch 201A bypasses Mix Mode capacitor 201C in Normal mode position and allows the sustainer output signal to pass through capacitor 201C in Mix mode position, which changes the harmonic mode content of the string vibration for an interesting sustained note tone. Mode control potentiometer 201B is normally adjusted to be full clockwise rotation to produce output voltage of preamplifier 224 that is in phase with sustained string vibration, which causes mostly fundamental harmonic mode vibration of strings 112, unless switch 201A is placed in the Mix position. If mode potentiometer 201B is rotated counterclockwise, the output voltage of preamplifier 224 is largely out of phase with the sustained string vibrations (somewhat altered by phase shift of bridge pickup 106), causing another interesting harmonic mode string vibration sound.

When sustainer 200B is OFF, the low-level signal produced by transducer 110A in response to instrument string vibrations is amplified by pickup amplifier 206 in standby state as described above. The amplified signal at the output of amplifier 206 passes through resistor 211 and is applied to terminal Nb of pickup selector switch 120. Variable resistor 212 adjusts the output level of amplifier 206 so that the perceived neck pickup volume is at a desired volume compared to the volume for the bridge and middle pickups. Amplifier output series resistor 211 is preferably approximately 20K ohms when bridge pickup B and middle pickup M are typical passive pickups. Resistor 211 is preferably between 1K and 10K ohms when bridge pickup B and middle pickup M are typical active pickups. These values for resistor 211 cause the blend of the signal from middle pickup M and the signal at neck pickup terminal Nb of pickup selector 120 to have equal volume when selector 120 is in position 4, which is the blend of middle pickup 108 and transducer 110A. If the value for resistor 211 is too low, the neck pickup dominates the blend. Conversely if the value for resistor 211 is too high, the middle pickup dominates the blend.

In 2008, Maniac Music Inc. added switch 230 to the Sustainiac Stealth Plus model as shown in the schematic of FIG. 2B. Associated with switch 230 are resistor R3 and capacitor C2. When 0.47 uF or 1 uF capacitor C2 was placed in parallel with 1000 or less ohm resistor R2, both in parallel with the input 204 of pickup amplifier 206, the resulting sound compared quite closely with the Fender Stratocaster single-coil sound. When 1 uF capacitor C2 was added in parallel with C1 by pole A of DPDT switch 230, the resonance frequency decreases more, and the resulting sound becomes more like a '59 PAF humbucker. Simultaneously pole B of DPDT switch 230 grounds one end of gain-setting resistor R3 in pickup amplifier 206, resulting in a gain increase of 6 dB. This new circuit in combination with the FIG. 2B sustainer circuit was named the Sustainiac Stealth Pro. The arrangement simulates the familiar and popular coil-tap arrangement of a humbucker. But since the bilateral coil and polepiece arrangement of the sustainer is inherently a hum-cancelling one, the Sustainiac Stealth Pro dual pickup sound had the advantage that the coil-tap sound was hum-free.

There are two limitations with this prior-art arrangement:

When selector 120 is in positions 1 or 4, dual adjacent pickup blend tones, previously described as having desirable "quack" or "twangy" tones, are compromised. Pickup output amplifier resistor 211 loads the inductive impedance of middle pickup 108 differently than another pickup of similar impedance characteristic. This difference of loading impedance changes the blend tone in a clearly audible manner. The desirable "quack" tone disappears. This is a significant limitation or disadvantage of prior art sustainers.

Several digital modeling devices are available on the market that allow the musician to select several different popular electric guitar sounds. The low impedance sustainer transducer design described herein and in the '759 patent has a flat frequency response when used as a pickup as previously described. But its sound can be changed to an almost infinite number of frequency responses by choosing appropriate parallel resonance capacitor values and also appropriate damping resistor values. No sustainer devices on the market have this multiple-pickup-sound capability, greater than the two-sound "coil-tap-simulation" capability of the Sustainiac Stealth Pro as shown in FIG. 2B.

Figure 2C:
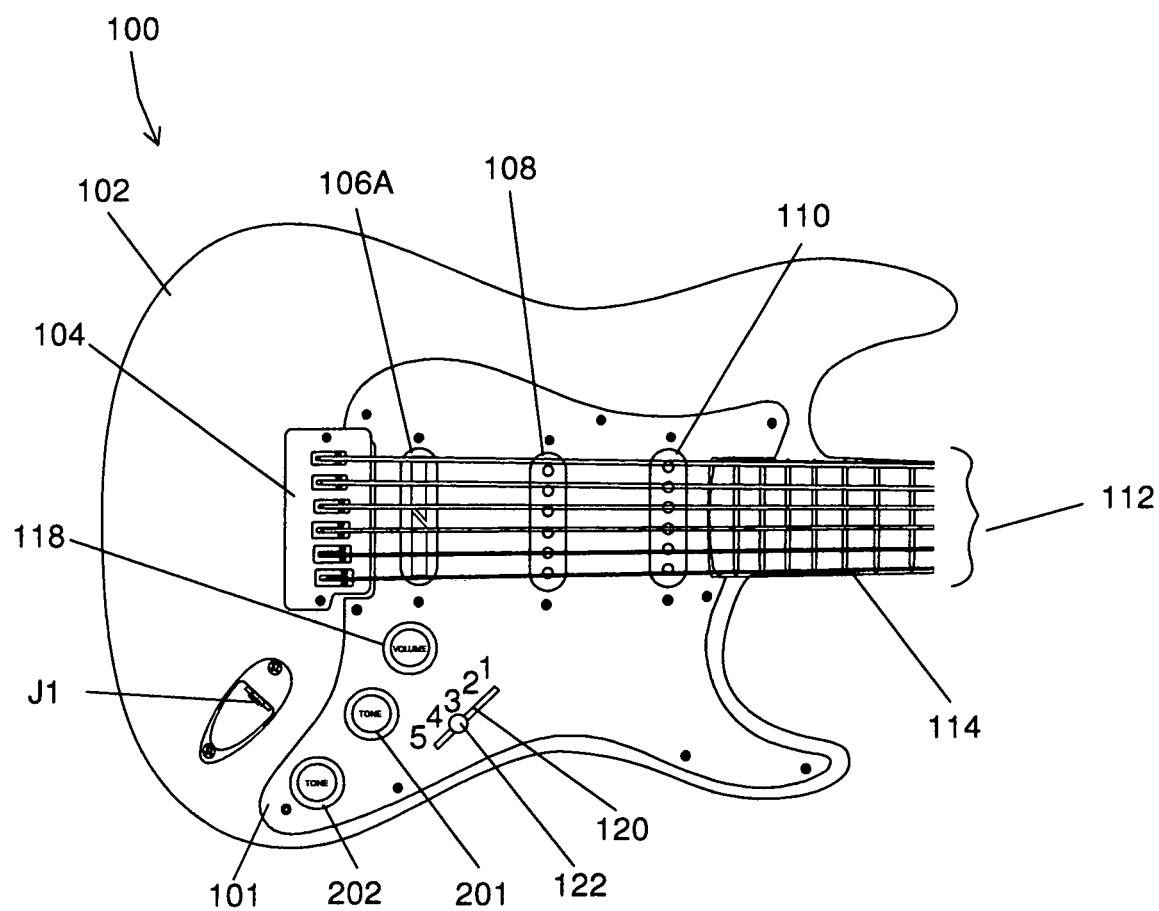
Figure 2D:
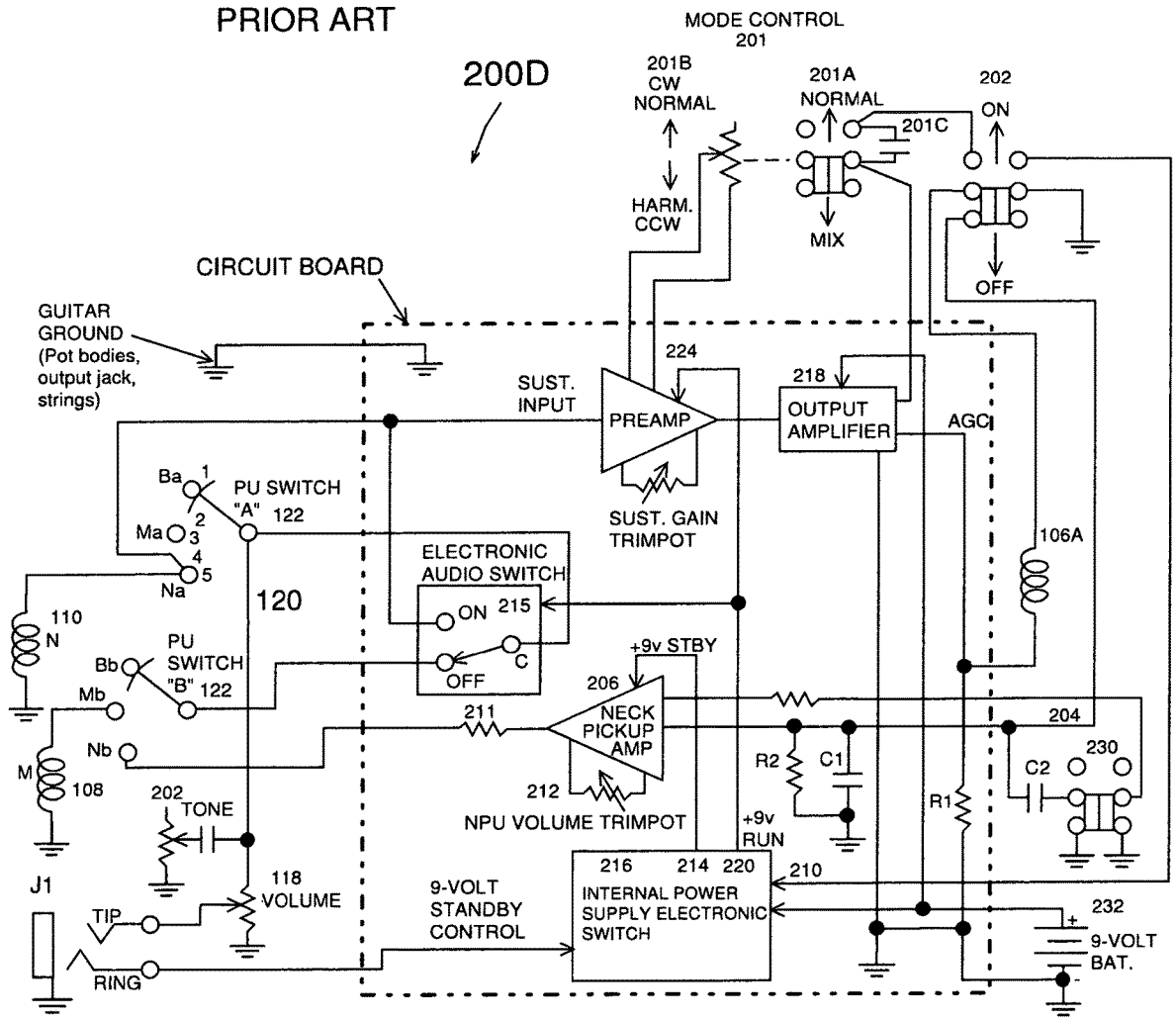

FIGS. 2C and 2D

The configuration of FIG. 2C and schematic 2D appeals to many guitar players, mostly those who prefer the deeper, less trebly tones of the neck pickup when playing music like the blues when sustainer 200D is ON. Bilateral sustainer transducer 106A is installed into the bridge pickup position as shown in FIG. 2C and sustainer 200D in block diagram 2D. Pickup selector 120 is rewired so that neck pickup 110 is connected to terminal Na of pickup selector switch 120. Bridge pickup 106 is removed from section A of selector switch 120. Output resistor 211 of pickup amplifier 206 is moved to position Bb of pickup selector 120. When sustainer 200D is switched OFF, bridge-position transducer 106A replaces neck position transducer 110A and functions as an active bridge pickup. When sustainer 200D is switched ON, neck pickup 110 is automatically connected as electronic switch 215 switches to the ON position. All other sustainer components of FIG. 2D are similar in operation to FIG. 2B including multiple pickup sounds associated with switch 230.

Many other players have musical styles that overlap both blues and "hard rock" styles, and even more styles. These players often alternate between the bridge pickup and the neck pickup. Unfortunately, the current state-of-the-art sustainers do not have this flexibility. A sustainer having driver transducers in both the bridge pickup position and also the neck pickup position would be a significant advancement in the art of sustainers. But electromagnetic sustainer prior art doesn't encompass this desirable characteristic.

Figure 2E:
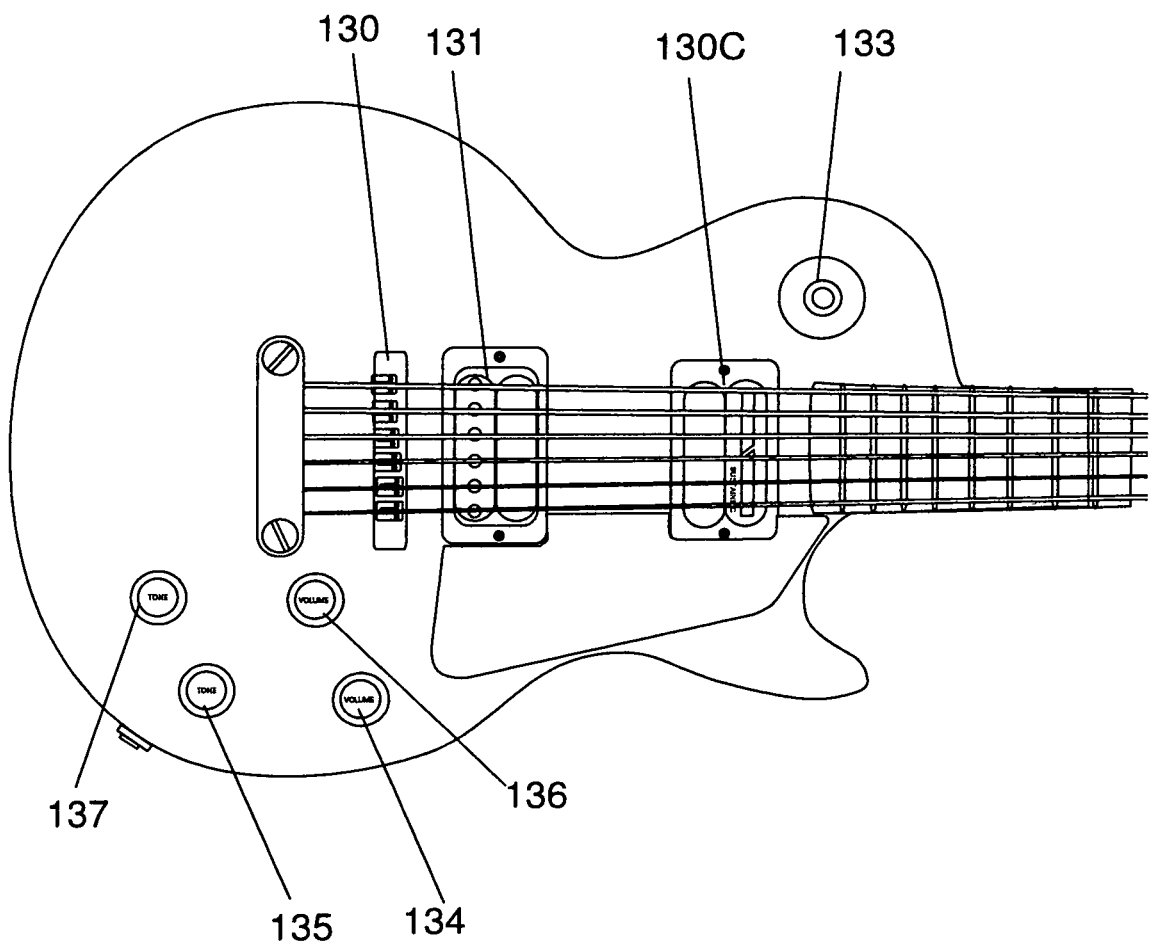
Figure 2F:
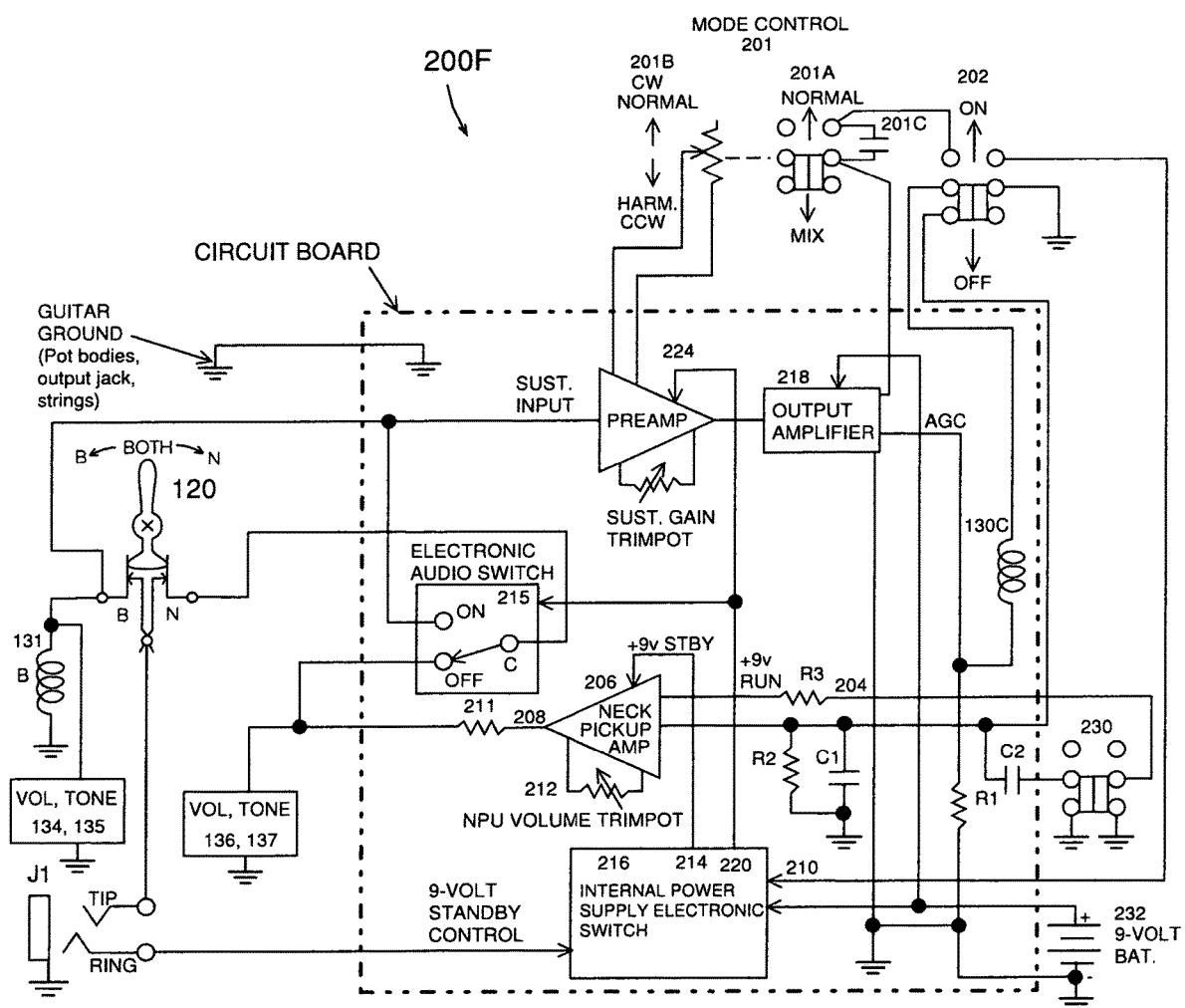
Figure 2G:
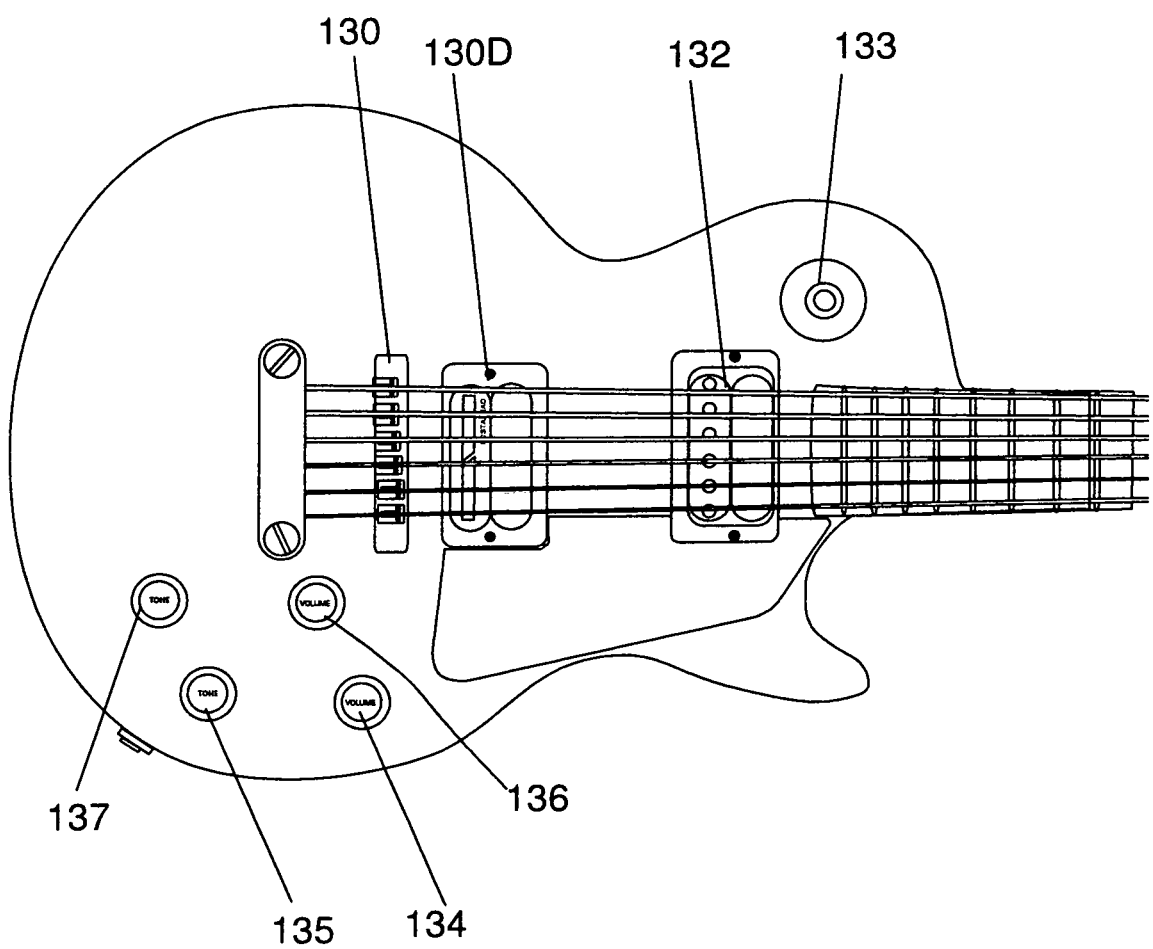

FIG. 2E and schematic 2F show the familiar Gibson Les Paul model guitar with sustainer bilateral transducer 130C mounted into the neck pickup position. When sustainer 200F of FIG. 2F is turned ON, bridge pickup 131 is automatically selected regardless of the position of pickup selector switch 120. The means of doing this is electrically similar to the way it is accomplished in FIG. 2B for 3-pickup guitars by actuation of electronic switch 215. In FIG. 2G electronic switch 215 terminal C is connected to terminal N (neck pickup terminal) of pickup selector 120 when sustainer 200F is OFF, and pickup selection is normal. When sustainer 200F is turned ON, Bridge pickup 131 is selected in all positions of pickup selector switch 120. All other sustainer components of FIG. 2F are similar in operation to FIGS. 2B and 2D including multiple pickup sounds associated with switch 230.

Figure 2H:
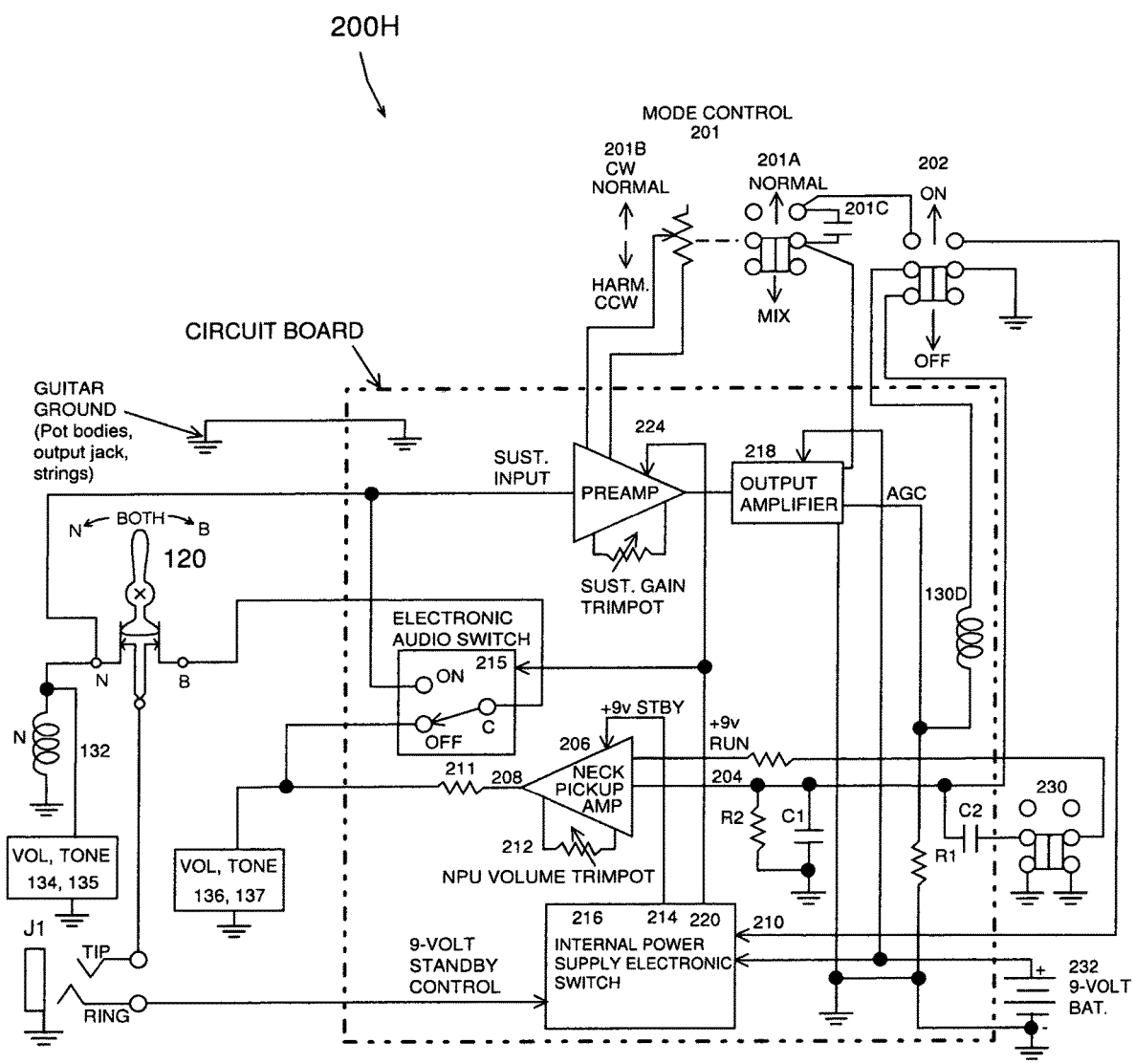

FIGS. 2G and 2H

FIG. 2G shows a Gibson Les Paul guitar body with sustainer bilateral transducer 130D mounted into the bridge pickup position instead of the neck pickup position. FIG. 2H shows the schematic for this arrangement. In FIG. 2G electronic switch 215 terminal C is connected to terminal B (bridge pickup terminal) of pickup selector 120. When sustainer 200H is OFF, pickup selection is normal. When sustainer 200H is turned ON, neck pickup 132 is automatically selected regardless of the position of pickup selector switch 120. All other sustainer components of FIG. 2H are similar in operation to FIG. 2B including multiple pickup sounds associated with switch 230.

As with the sustainer-equipped Stratocaster shown in FIGS. 2A and 2C, it would be advantageous if the sustainer-equipped Les Paul guitars of FIGS. 2D and 2G have driver transducers in BOTH the bridge pickup position and also the neck pickup position, such that when the sustainer is turned on, one transducer is functioning as a pickup while the other functions as the sustainer driver. But the current state-of-the-art doesn't encompass this desirable characteristic. In order to have this capability, a player has to have two instruments, one with the sustainer transducer in the neck position, and another with the sustainer transducer in the bridge position. Unfortunately, even with this solution, it is impractical to easily switch back-and-forth, such as to change tonal characteristics in the middle of a song.

Sustainer Driver Transducer Design Review

In U.S. Pat. No. 4,941,388, the inventors described a sustainer which was designed to have robust performance as previously defined. The driver described in '388 minimizes magnetic crosstalk between the driver transducer and an instrument pickup.

Figure 3A:
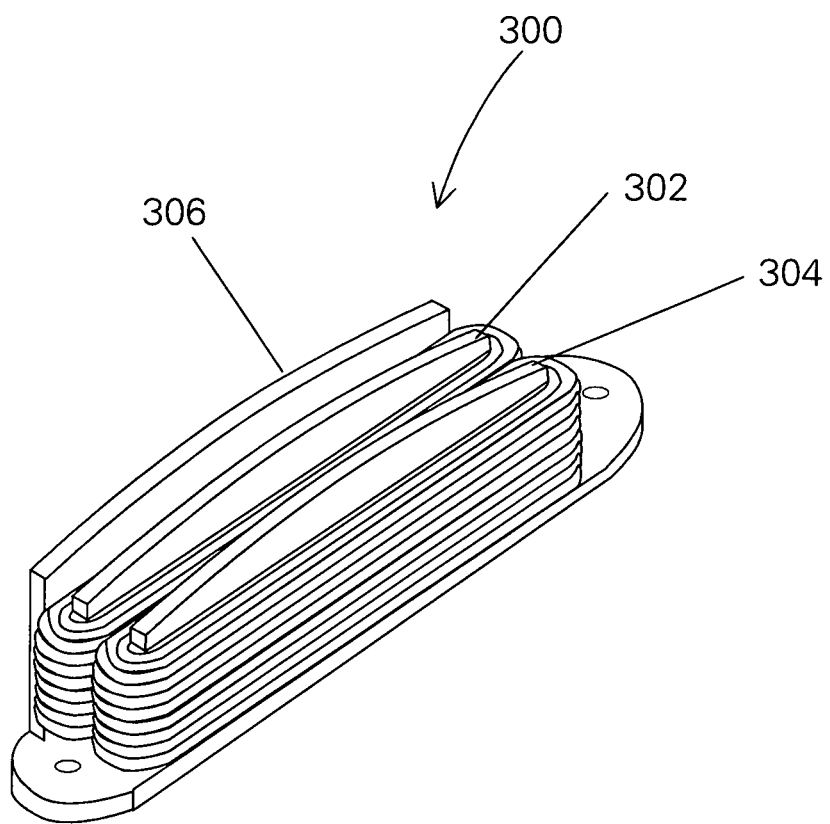

The Sustainiac GA-1 and GA-2 sustainers were introduced in 1988 and 1989 respectively. These sustainers were based on the '388 patent. The driver transducer construction was based on the drawing shown in FIG. 18 of the '388 patent, and shown in oblique view for convenience in FIG. 3A. Driver 300 has approximately the same length and width as the single-coil pickups of the Fender Stratocaster. The outward appearance is similar to common "rail pole piece" humbucker pickups that have been available since at least the 1980's. FIG. 3A shows the familiar rail polepieces 302 and 304, with the addition of a third "shunt plate" 306 that minimizes magnetic crosstalk between the driver transducer and an instrument pickup.

This '388 driver design enabled sufficient sustainer amplifier gain to be set so that sustainer performance was quite robust in guitars having a humbucker pickup that furnished the sustainer input signal, without uncontrolled oscillation occurring. The result was that these sustainers were commercially successful. Many are still being used at the present time. An undesirable aspect of the '388 driver design was that it would not function well in a guitar such as the Fender Stratocaster with single-coil pickups, because the magnetic field cancellation between driver and pickup was insufficient for use with single-coil pickups. If the sustainer amplifier gain was increased to improve the sustainer robustness, an uncontrolled oscillatory condition would develop due to excessive magnetic crosstalk from driver to pickup. When the '388 driver was paired with a humbucker pickup that furnished the sustainer input signal, the pickup had to be oriented so that the north magnetic poles of the humbucker faced the driver. Otherwise the magnetic cancellation was less complete, resulting in compromised sustainer performance.

Figure 3B:
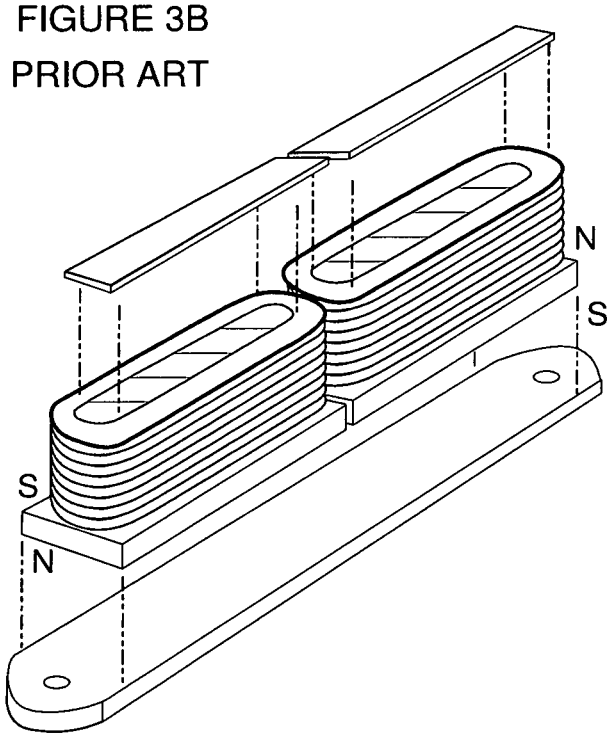
Figure 3B:
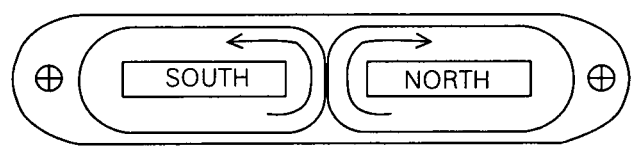
Figure 3B:
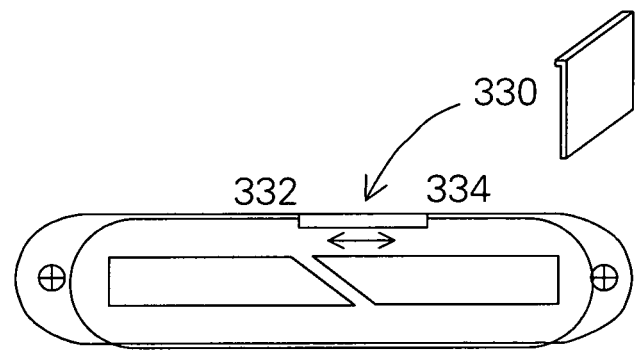

U.S. Pat. No. 5,932,827 described a driver transducer design for electromagnetic sustainers, having side-by-side ("bilateral") magnetic polepieces. FIG. 3B shows oblique and top views of the physical embodiment of that driver 310. The '827 driver 310 was superior to '388 driver 300 because its magnetic field cancellation at the pickup location of typical guitar pickups was more complete than the '388 driver. Magnetic cancellation was sufficient that it could be used with a single coil pickup that provides sustainer input signal.

A further improvement of this bilateral driver design described in the '827 patent was the addition of a magnetically permeable sliding plate 330 to driver 300 which is shown in the drawings of FIG. 3B. Plate 330 is positioned by sliding back and forth in directions 332 and 334 as shown. The magnetically permeable sliding plate allows the inductance of each of the bilateral driver coils to be changed by repositioning the plate. By placing the magnetically permeable plate closer to one coil than the other, the inductance of that respective coil is increased relative to the other coil. The coil with raised inductance radiates less flux than the other coil when both coils are connected in parallel, because the coil with raised inductance has higher impedance for alternating applied voltage than the other coil. By carefully moving this sliding plate while increasing the gain of the sustainer amplifier, a plate position can be determined whereby the total north-seeking flux polarity radiated by the driver that is sensed by the pickup is rather precisely balanced by the total south-seeking flux polarity. This results in a substantially reduced amount of magnetic crosstalk between the driver and pickup. The improvement in reduced crosstalk that the sliding plate contributes can be of the order of 20 dB. The precise position whereby optimum flux cancellation is achieved is easy to determine simply by playing sustained notes, while listening to the pickup output signal through an ordinary electric guitar amplifier. This null position is easily determined empirically by listening for the sliding plate position that produces a minimum amount of distortion characteristic of the sound.

One sustainer that was produced in very limited quantities in the 1980's was called the Infinite Guitar, and is used by guitar player "The Edge" of the famous band U2. The Infinite Guitar was invented by Michael Brook from Canada. This sustainer used common "stacked humbucker" pickups on a guitar with three single-coil size pickup cutouts, similar to the Fender Stratocaster. One of the pickups provides the input signal for the sustainer amplifier, and another one functions as the sustainer driver.

One problem with using conventional high impedance pickups for the sustainer driver is that the signal amplitude at the output of the sustainer amplifier must be several hundred volts in order to produce adequate sustained string vibration amplitude. The Infinite Guitar used an external foot-controlled electronics floor-positioned box that contained the high-voltage sustainer amplifier. Such an arrangement is cumbersome and potentially dangerous due to the lethal voltage levels in proximity to the hands.

Since all three of the pickups are essentially the same, it would be possible to swap the functions of the bridge pickup and neck pickup, one functioning as the sustainer driver while the other functions as the pickup. Such a combination would produce a multi-driver sustainer. But the Infinite guitar was never produced in a multi-driver sustainer configuration.

Conventional active pickups cannot be used to make a multi-driver sustainer because the pickup output cannot be driven with a sustainer amplifier output signal. This is because all active pickups currently have internal battery-powered linear output amplifiers, and the pickup electronics are encapsulated and therefore not accessible.

SUMMARY OF THE EMBODIMENTS

The main aspect of all the embodiments described herein is an electromagnetic sustainer for a stringed instrument as described in the prior art, comprising at least one pickup, one driver transducer, and a sustainer amplifier. Except that all the pickups of the stringed instrument are low impedance electromagnetic transducers (hereinafter called simply transducers), and none of the pickups of the instrument are conventional passive high impedance electromagnetic transducers or conventional active pickups as seen on most current electric stringed instruments. The embodiments show different means of selecting which transducers function as instrument pickups and which transducers function as sustainer drivers. If a transducer is connected to the input of a pickup amplifier, then it functions as an instrument pickup. The instrument pickup amplifier output connects to the instrument output and also to the sustainer amplifier input. When a transducer is connected to the output of a sustainer amplifier then it functions as a sustainer driver. When a transducer is being used as a sustainer driver, it cannot be simultaneously used as a pickup. When a pickup selector switch simultaneously selects the instrument pickup and also the sustainer driver, then the sustainer is defined as pickup-selector-prioritized. When the sustainer is turned on and the pickup selector switch is bypassed by the sustainer on-off switch, and the driver selector switch simultaneously selects the sustainer driver and also the instrument pickup, then the sustainer is defined as driver-selector-prioritized.

The embodiments described herein show instruments with either two or three transducers. An advantage of using multiple low impedance transducers to function as all of the instrument pickups is that the blend sounds of adjacent selected transducers produce pleasant blend sounds, unlike prior-art electromagnetic sustainers where amplified transducers were blended with conventional passive or active pickups. Another advantage of using multiple low impedance transducers to function as all of the instrument pickups is that numerous desirable pickup sounds can be achieved by adding resonance and damping components in parallel with low impedance transducers being used as pickups.

MULTI-DRIVER DRAWING LIST

FIG. 1A Prior Art Fender Stratocaster Guitar Front View

FIG. 1B Prior Art Fender Stratocaster Guitar Electrical Schematic

FIG. 1C Prior Art Fender Stratocaster Guitar Front View with humbucker bridge pickup FIG. 1D Prior Art Gibson Les Paul Guitar Front View FIG. 1E Prior Art Gibson Les Paul Guitar Electrical Schematic FIG. 2A Prior Art Fender Stratocaster Guitar Front View with Sustainiac electromagnetic driver transducer installed into the neck pickup position FIG. 2B Prior Art Fender Stratocaster Guitar Electrical Schematic of guitar shown in FIG. 2A FIG. 2C Prior Art Fender Stratocaster Guitar Front View with Sustainiac electromagnetic driver transducer installed into the bridge pickup position FIG. 2D Prior Art Fender Stratocaster Guitar Electrical Schematic of guitar shown in FIG. 2C FIG. 2E Prior Art Gibson Les Paul Guitar Front View with Sustainiac electromagnetic driver transducer installed into the neck pickup position FIG. 2F Prior Art Gibson Les Paul Guitar Electrical Schematic of guitar shown in FIG. 2E FIG. 2G Prior Art Gibson Les Paul Guitar Front View with Sustainiac electromagnetic driver transducer installed into the bridge pickup position FIG. 2H Prior Art Gibson Les Paul Guitar Electrical Schematic of guitar shown in FIG. 2G FIG. 3A Electromagnetic Driver Transducer of U.S. Pat. No. 4,941,388 and for Sustainiac GA-1, GA-2 sustainer FIG. 3B Electromagnetic Driver Transducer for Sustainiac U.S. Pat. No. 5,932,827 and for Sustainiac Stealth models sustainer FIG. 4A Sustainer with Three low-impedance transducers, Pickup-Prioritized Diagram FIG. 4B Sustainer with Three low-impedance transducers, Pickup-Prioritized Diagram, with dual sustainer amplifiers FIG. 4C Detail showing dual sustainer amplifier time-delay turn-on from FIG. 4B.

Figure 4A:
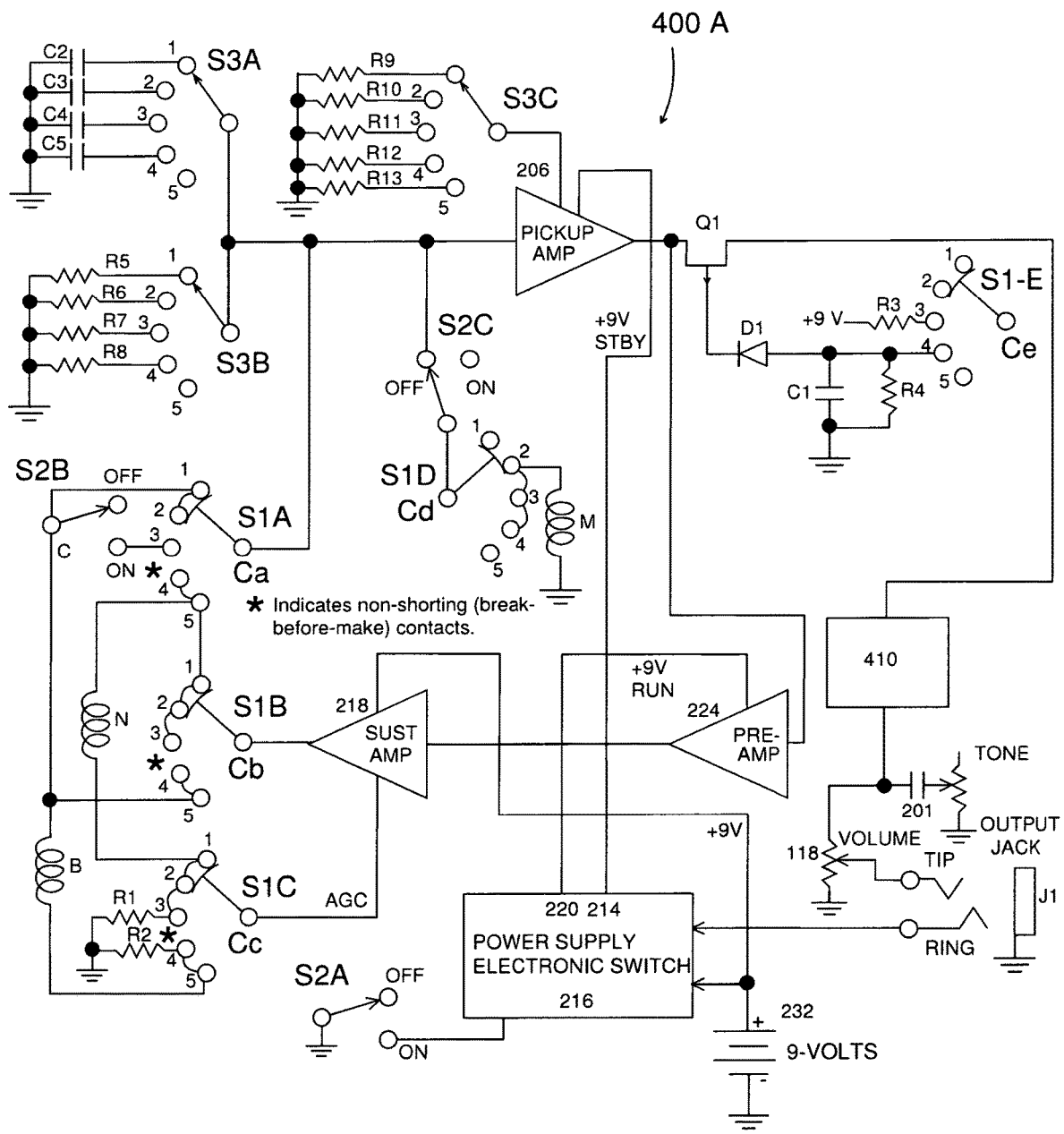
Figure 4B:
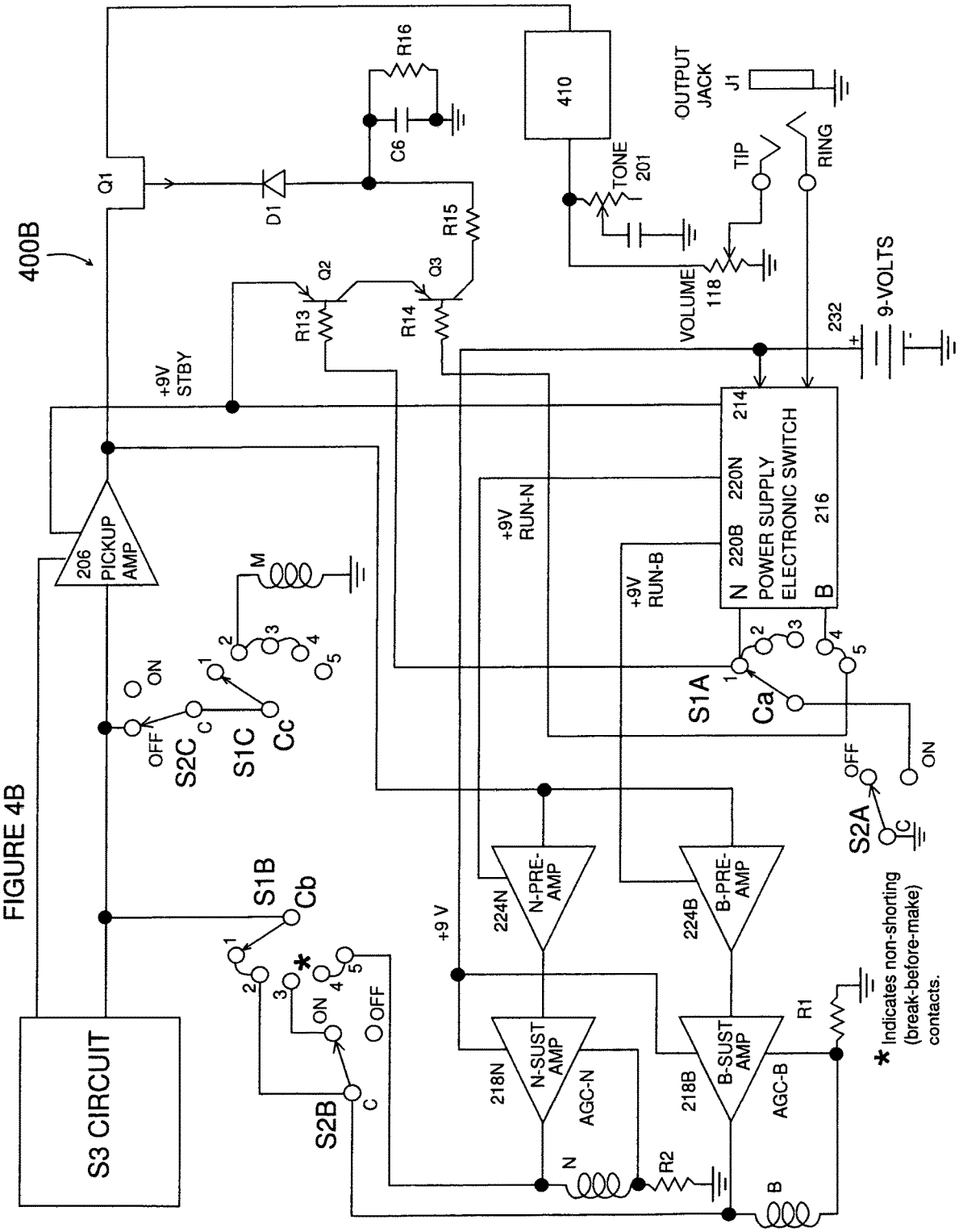
Figure 4C:
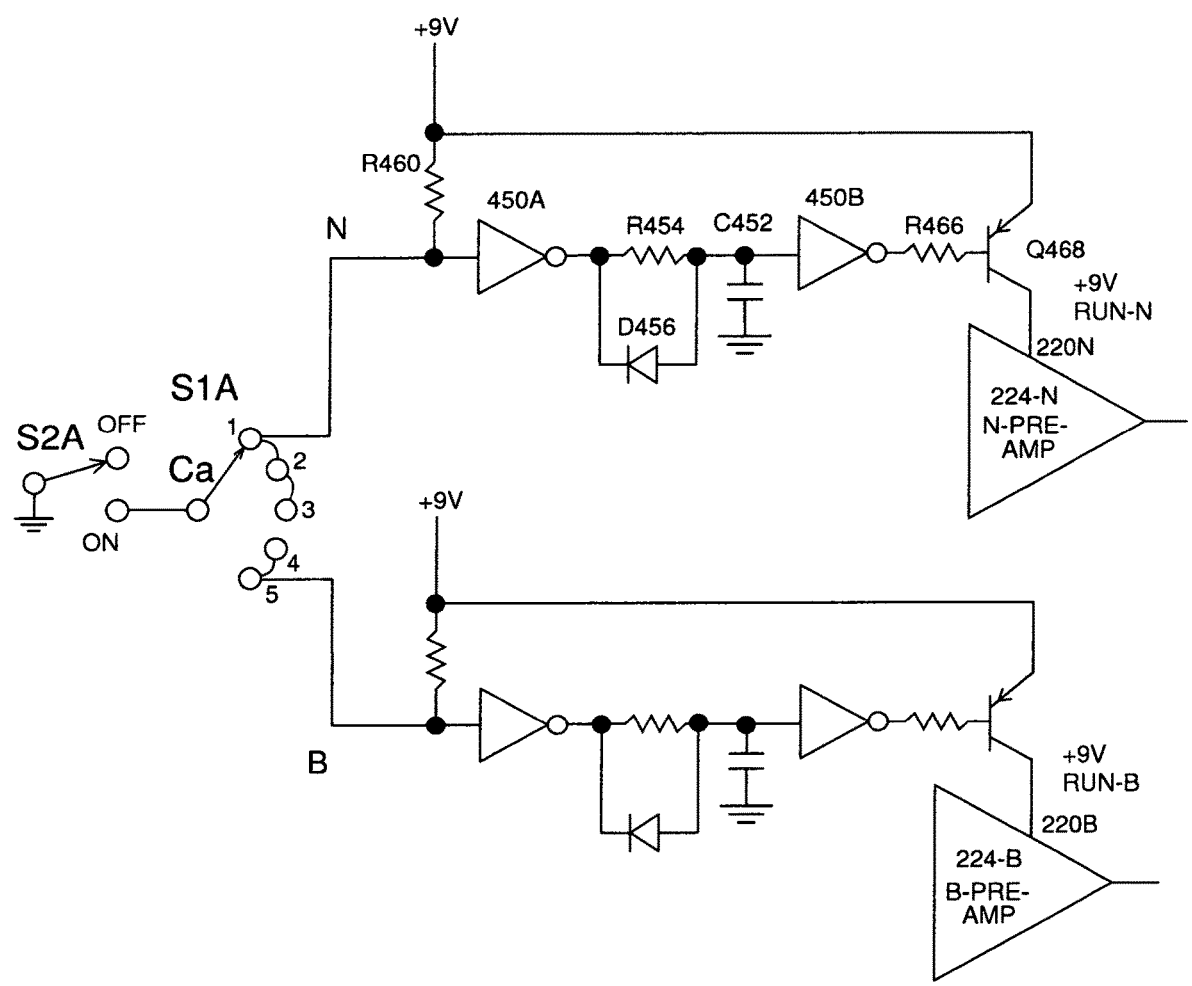
Figure 4D:
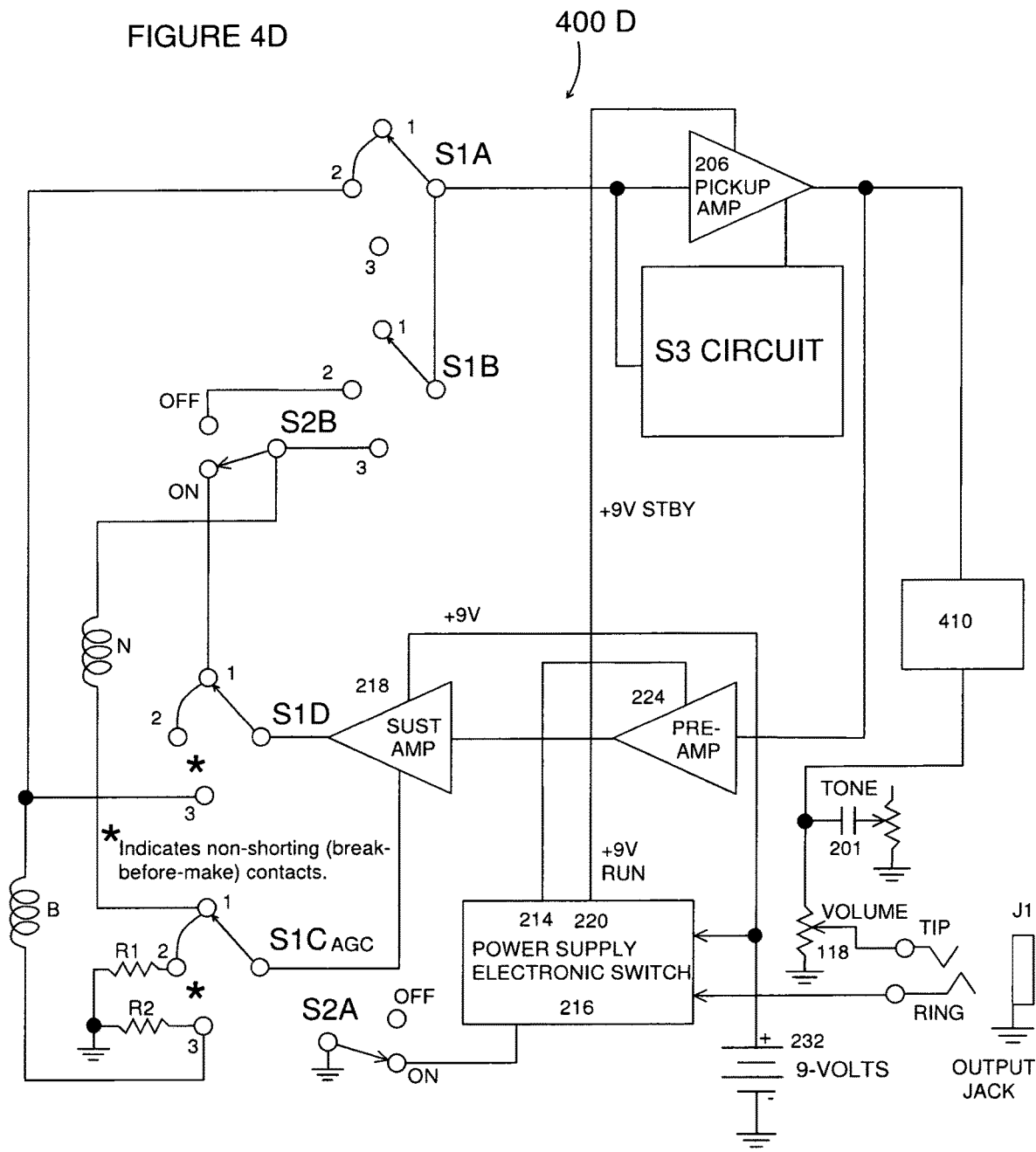
Figure 4E:
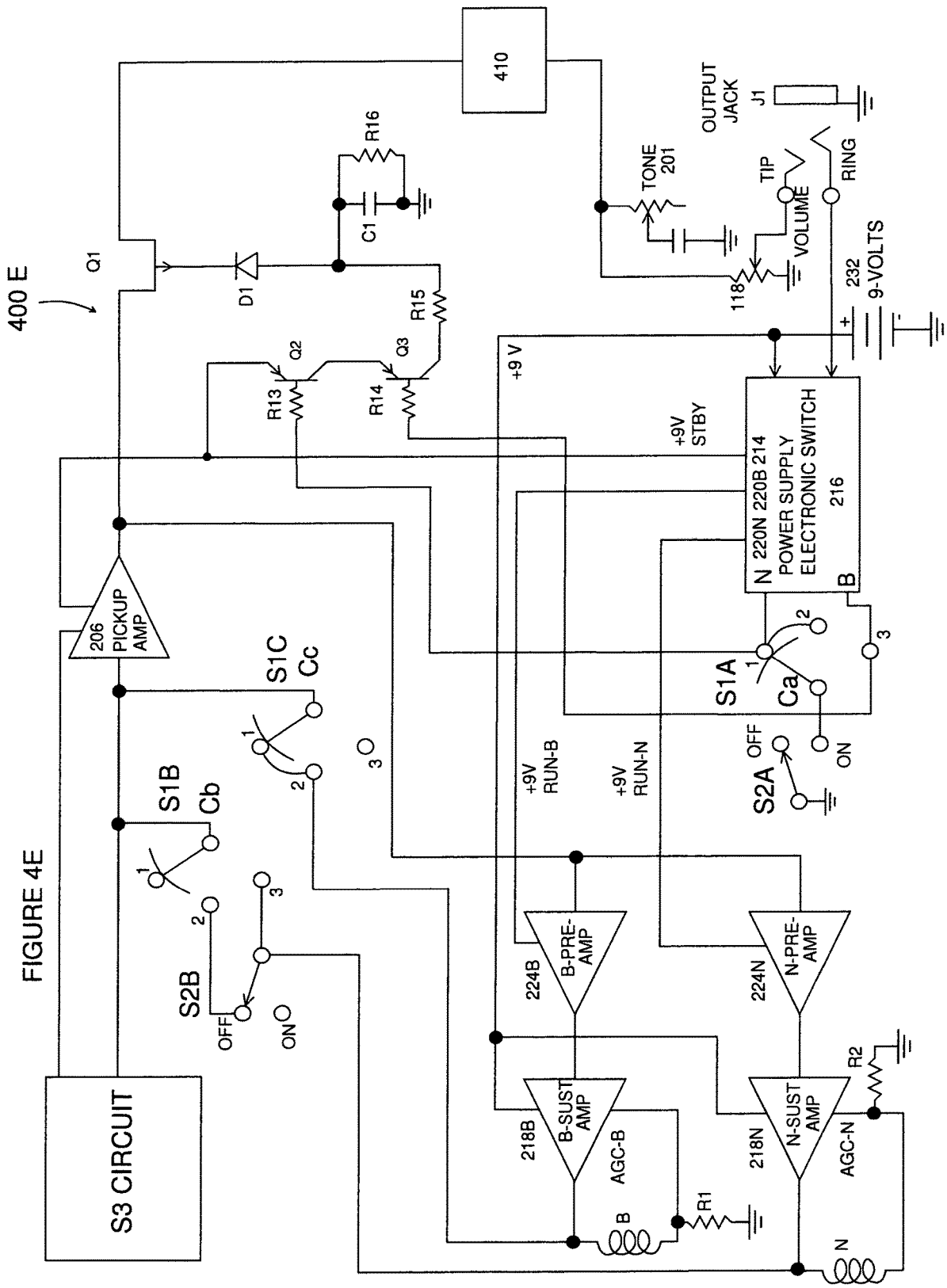
Figure 5A:
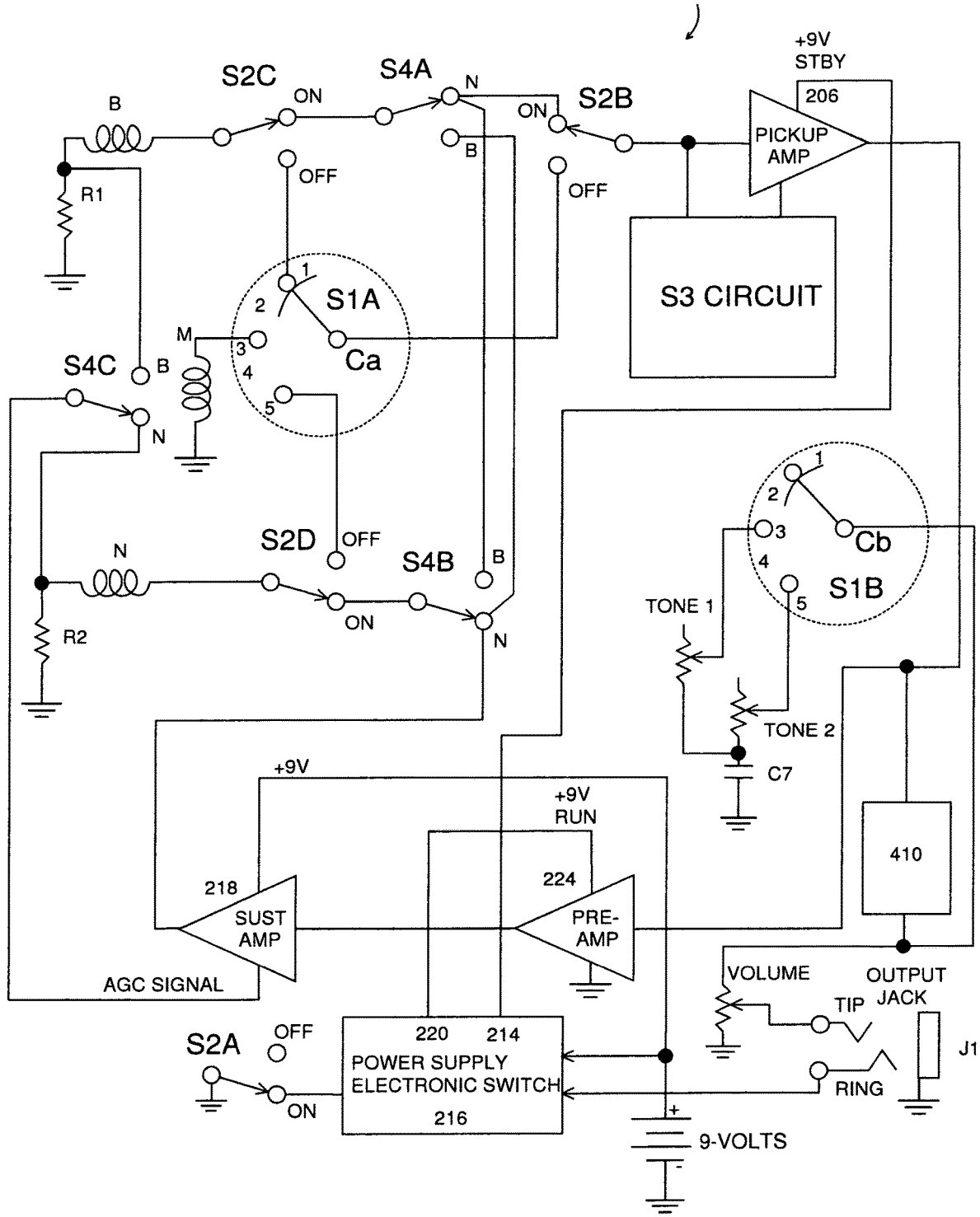
Figure 5B:
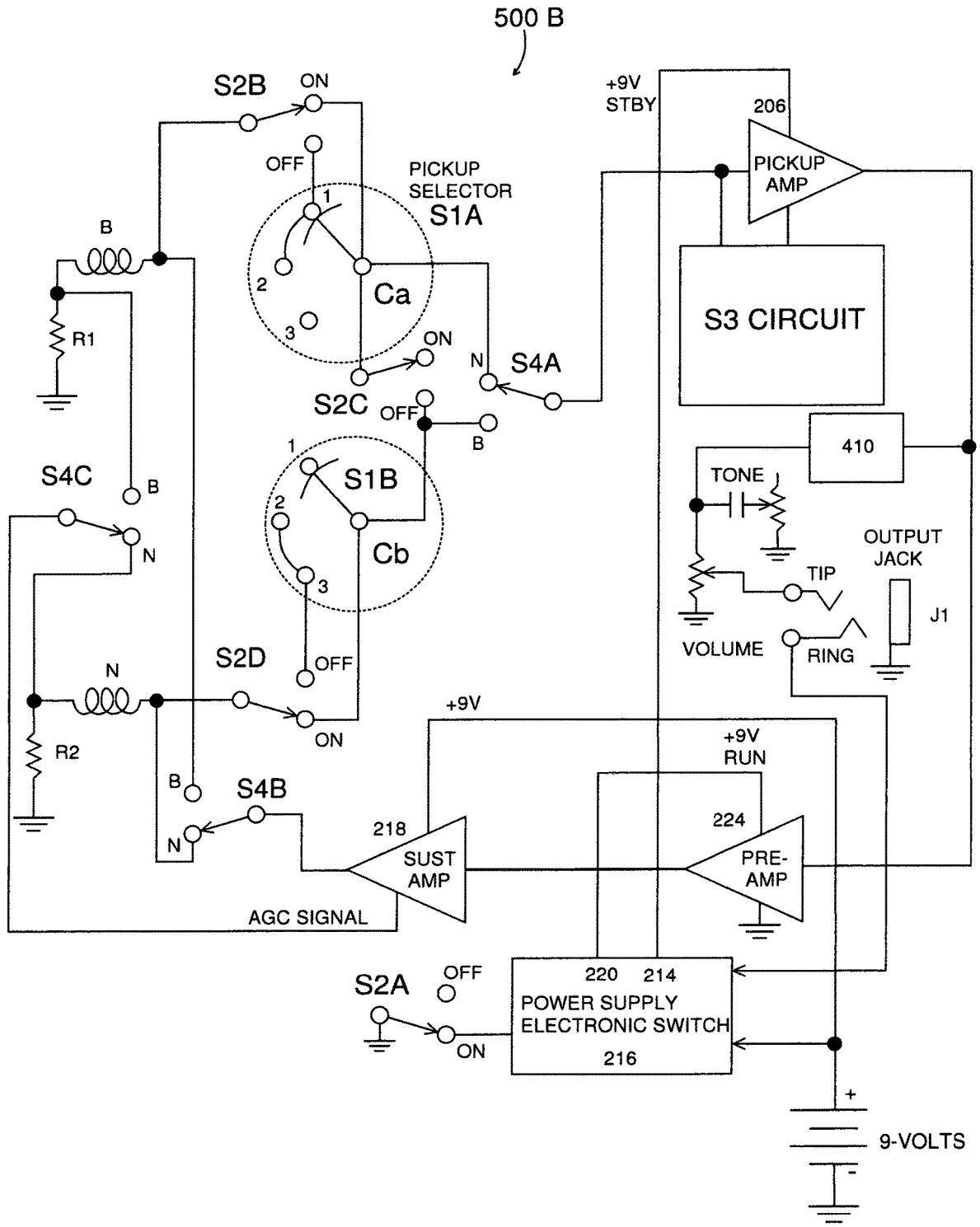
Figure 5C:
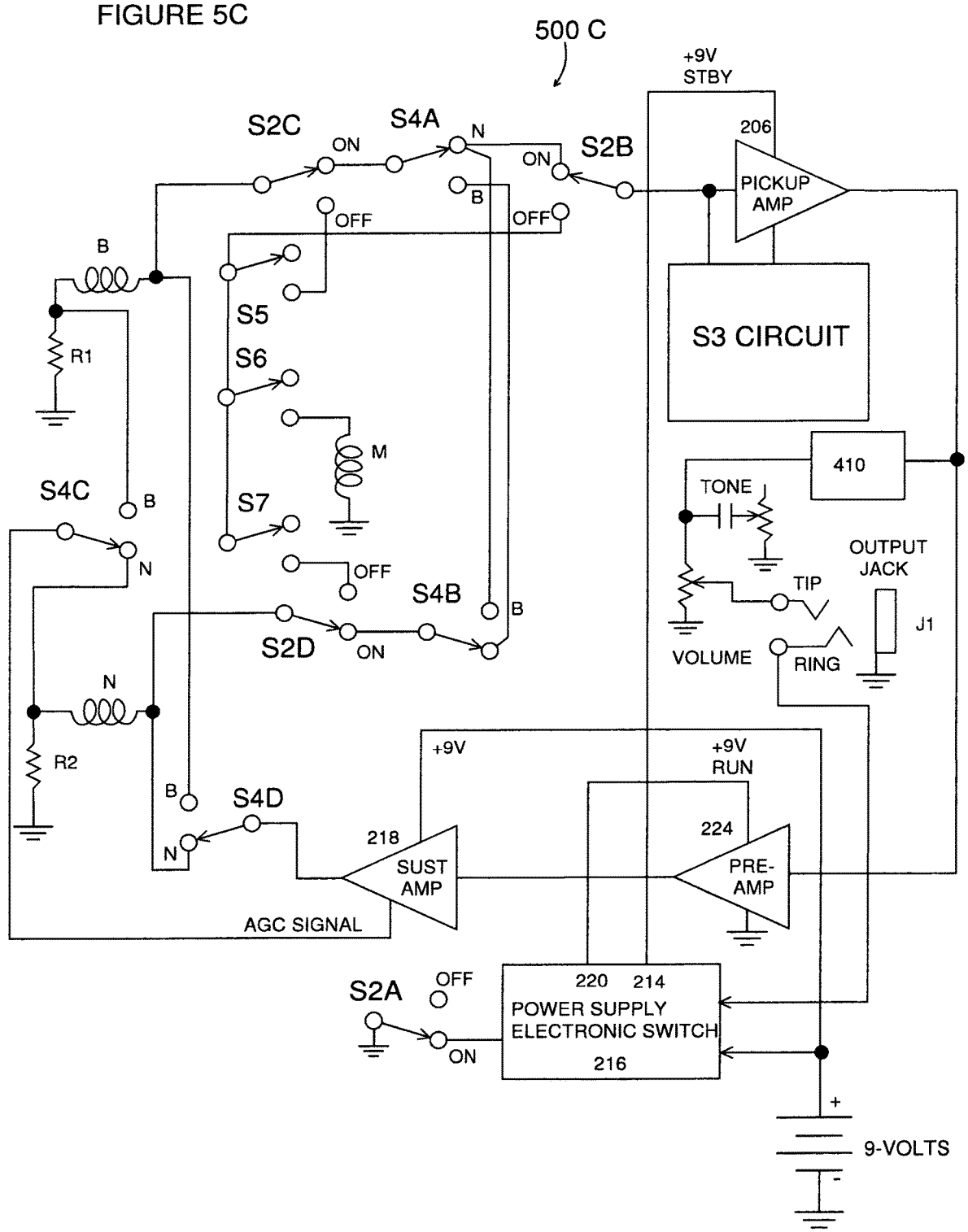
Figure 5D:
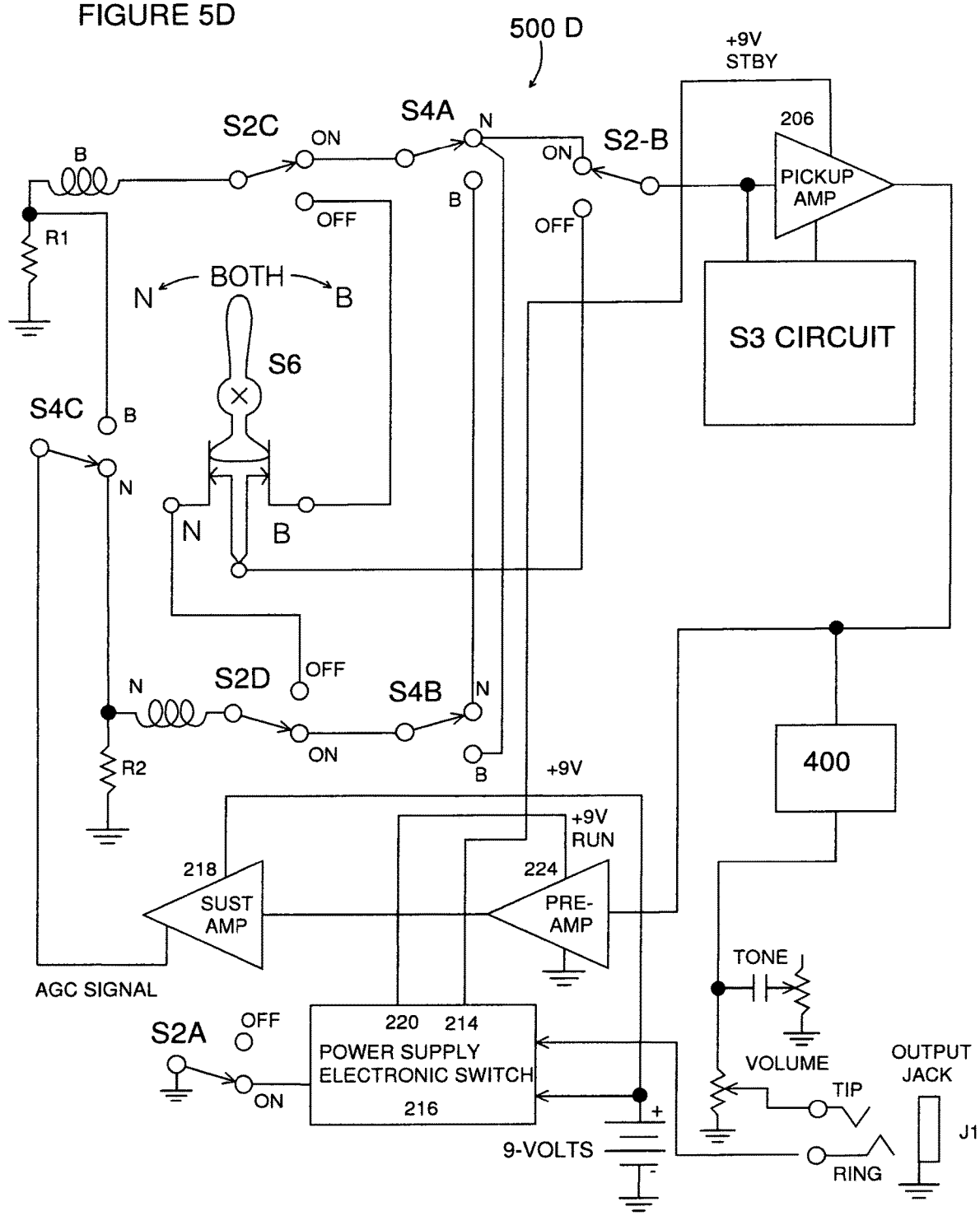
Figure 5E:
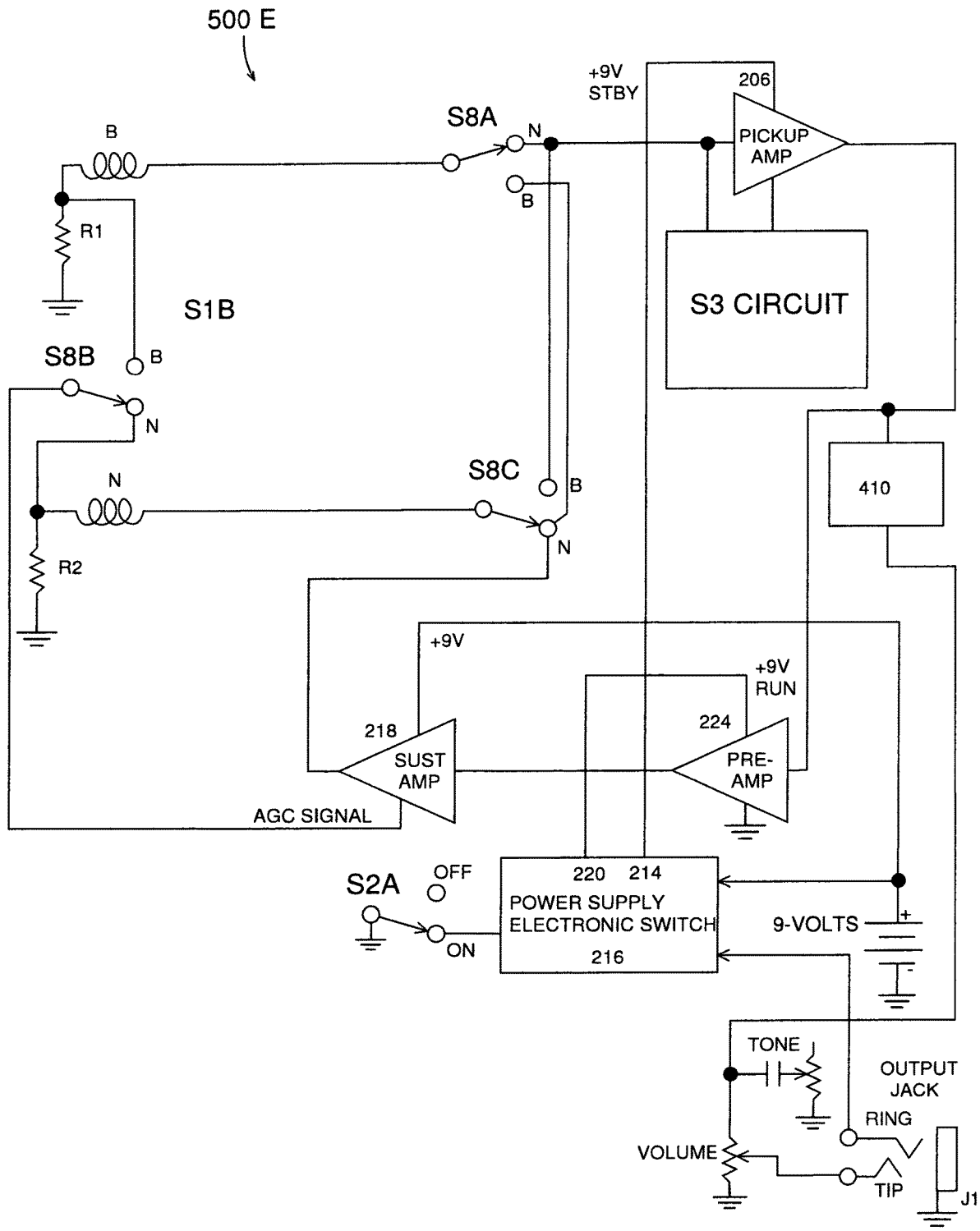

FIG. 4D Sustainer with Two low-impedance transducers, Pickup-Prioritized Diagram FIG. 4E Sustainer with Two low-impedance transducers, Pickup-Prioritized Diagram, with dual sustainer amplifiers FIG. 5A Sustainer with Three Drivers, Driver-Prioritized Diagram FIG. 5B Sustainer with Two Drivers, Driver-Prioritized Diagram FIG. 5C Sustainer with Three Drivers, Alternative Driver-Prioritized Diagram FIG. 5D Sustainer with Two Drivers, Alternative Driver-Prioritized Diagram FIG. 5E Sustainer with Two Drivers, Simplified Driver-Prioritized Diagram

DESCRIPTION OF THE EMBODIMENTS

If a transducer is disposed in a position in close proximity to the instrument bridge, then that transducer is called a bridge transducer. If another transducer is disposed in a position in close proximity to the instrument neck, then that transducer is called a neck transducer. If a transducer is disposed in a position between the bridge transducer and the neck transducer, then that transducer is called a middle transducer.

Electric guitars are discussed in most of the embodiments. The embodiments can be similarly used in other types of stringed instruments having electric pickups such as mandolins, lap steels, steel guitars etc.

The instrument sustainer embodiments described herein have either two or three low impedance electromagnetic transducers (transducers) that function as the instrument pickups when the sustainer is in "standby-state", abbreviated simply as "standby". The term standby means that electrical power is applied to most circuits including the pickup amplifier. But the sustainer output amplifier itself is not activated because the sustainer ON-OFF switch is in the OFF position. When the sustainer is placed in standby, each electromagnetic transducer functions as an active electromagnetic pickup and is connected to the input of a pickup amplifier when selected by a pickup selector switch or similar apparatus. When an instrument is placed into standby state, the typical method of doing so is to insert a conventional ¼ inch diameter guitar plug into the instrument output jack as described in the prior art FIGS. 2B, 2D, 2F, and 2H schematics, which activates the standby circuit.

Another aspect of the embodiments is that when a multi-driver sustainer is in the standby-state in an instrument with two or three pickups, the blend sound of adjacent transducers (neck/middle or bridge/middle) functioning as active pickups has the desirable blend tones that were described and discussed in the Prior Art section. This is because the impedance and phase response characteristics of the multiple low impedance electromagnetic transducers is similar, unlike the blend of prior-art sustainers when operating in the standby-state with the driver transducer functioning as a pickup, blended with a conventional high impedance passive or active pickup.

The natural resonance frequency of the low impedance transducers of the embodiments is over thirty kilohertz, which is above the frequency range of human hearing. Across the 20 Hz to 20 KHz range of human hearing the frequency response is essentially flat, deviating only a fraction of a dB. This flat frequency response does not exist with present passive electromagnetic pickups that have sufficient output level to produce typical desirable listening levels when applied to existing instrument amplifiers.

Another aspect of the embodiments is that when the sustainer is in the standby-state in an electric guitar, a multitude of different pickup sounds can be created and selected by manipulating the resonance frequency and bandwidth of the inductive transducers and gain of the pickup amplifier. This can be accomplished by connecting capacitors and resistors in parallel with the transducer to manipulate the resonance frequency and also frequency bandwidth. Furthermore, the transducer pickup amplifier gain can be manipulated by connecting different value pickup amplifier gain-setting resistors. Pickup frequency response manipulation can also be accomplished by adding active filters in series with the output of the pickup amplifier circuit. If the active filter output is applied to the instrument output but not the input of the sustainer amplifier, then the various active filter frequency response settings will have no effect upon the sustainer operation, which can be a desirable characteristic.

For the following embodiments, if the sustainer is turned on, and the bridge transducer is functioning as the instrument pickup, then the neck transducer will function as the sustainer driver. Conversely if the neck transducer is functioning as the instrument pickup, then the bridge transducer will function as the sustainer driver. The transducer selection can be either pickup-prioritized or driver-prioritized. These terms will be defined in the following embodiment drawings and descriptions.

In the course of developing a multi-driver sustainer, it was found that the best magnetic cancellation and consequently the best sustainer performance was achieved when either the neck transducer or bridge transducer is of the "rail" type as described and claimed in U.S. Pat. No. 4,941,388 and shown in FIG. 3A, while the oppositely opposed transducer is of the bilateral type as described and claimed in U.S. Pat. No. 5,932,827 and shown in FIG. 3B. If one of these transducer types functions as the bridge pickup, then the other transducer type functions respectively as the neck driver. Conversely if one of these transducer types functions as the neck pickup, then the other transducer type functions as the bridge driver. Other combinations such as two of '827 bilateral type designs or two of '388 rail type designs provide less complete magnetic cancellation resulting in sustainer performance that is not as good as if one of each different type is used.

Overview of FIGS. 4 and 5

FIGS. 4A, 4B, 4D, and 4E depict sustainers 400A, 400B, 400D and 400E respectively, showing different embodiments of a pickup-prioritized multi-driver sustainer. All of the sustainer embodiments shown in the FIG. 4 drawings use the similar sustainer function blocks as shown in prior art FIG. 2: Power supply switch 216, 9V power supply 232, 9 v standby supply 214, 9 v run supply 220, sustainer preamp 224, sustainer amplifier 218, and pickup amplifier 206 as described in prior art sustainers of FIGS. 2B, 2D, 2F, and 2H. Also shown are instrument volume and tone controls 118 and 201 respectively, and ¼ inch TRS output jack J1, as they are typical or similar for most electric guitar models. Other volume and tone control arrangements are common for electric stringed instruments, and are not important to the embodiments described herein, even though most of the tone control arrangements will have an effect on the sustained notes. If the tone controls are set to the maximum treble position while the sustainer is on, then the tone control effect upon sustainer performance will be negligible.

Similarly, FIGS. 5A, 5B, 5C, and 5D depict sustainers 500A, 500B, 500C and 500D respectively. These show different embodiments of a driver-prioritized multi-driver sustainer. All of the several sustainer embodiments shown in the FIG. 5 drawings use similar prior art sustainer components as described in the previous paragraph for FIG. 4 drawings.

These will not be re-described for each embodiment as shown in the several FIGS. 4 and 5 in order to reduce wordiness.

Pickup-Prioritized Sustainers

FIG. 4A

DESCRIPTION

FIG. 4A depicts a schematic of the controls and other electrical components of an electric stringed musical instrument that contains sustainer 400A. This comprises low impedance transducers B, M, and N, five-section, 5-position rotary pickup selector switch S1, having sections A,B,C,D, three-section, 2-position sustainer ON/OFF switch S2 having sections A,B,C, sustainer power supply and sustainer components from prior art FIG. 2, pickup muting circuit comprising FET transistor Q1, resistors R3 and R4, capacitor C1 and diode D1. Three-section, 5-position rotary pickup sound switch S3 selects resistors R5-R12, and capacitors C2-R5. Optionally this could be replaced by individual selector switches for each resistor/capacitor pair, or other switching apparatus having more or less positions.

Further optionally, a pickup sound selector circuit can be a set of active filters, shown as block 410, which is disposed between the output of pickup amplifier 206 and the instrument output, but not to the input of sustainer preamp 224. Active filter circuit details are not shown because there are so many well-known tone-shaping filters.

FIG. 4A Operation

Sustainer 400A is configured as a pickup-prioritized multi-driver sustainer. Three low-impedance electromagnetic transducers in the bridge pickup position, middle pickup position, and neck pickup position are labelled B, M, and N respectively. Pickup selection is accomplished by pickup selector switch S1, which can be a lever-actuated rotary switch as shown, knob-actuated rotary switch, or individual switches such as toggle or slide switches etc. If a pickup is selected, then that transducer will not function as the sustainer driver when the sustainer is activated. Another transducer will serve as the sustainer driver. This is the definition of a pickup-prioritized multi-driver sustainer.

Pickup selector switch S1 of sustainer 400A comprises five separate sections, S1A through S1E. As contactors Ca, Cb, Cc, Cd, Ce move from positions 1-5, they momentarily short adjacent contacts in between each position except for between positions 3 and 4 for sections S1A, B, C, as shown by the asterisk marks (*) on the drawing.

Pickup selector section S1A of sustainer 400A connects low impedance transducers B and N to the input of pickup amplifier 206 when sustainer ON-OFF switch S2 is in the OFF position. In standby mode these transducers function as bridge pickup and neck pickup respectively. S1D controls the selection of middle transducer M. In position 1, S1A selects bridge transducer B by connecting it to the input of pickup amplifier 206. Position 2 selects the combination of bridge transducer B and middle transducer M. Position 3 selects middle transducer M. Position 4 selects the combination of middle transducer M and neck transducer N. Position 5 selects neck transducer N.

For positions 2 and 4 of selector S1, the B/M transducer combination and N/M transducer combination, respectively, produce the desirable "quack-tones" (or "twang-tones") as described in the Prior Art section. This is because of the similar impedance of the transducers when functioning as pickups, causing their frequency and phase response to be similar. This characteristic is not true for prior art sustainers combining low and high impedance transducers as pickups.

When sustainer ON-OFF switch S2 is changed to the ON position, +9 volt RUN voltage 220 is applied to sustainer preamplifier 224, which activates sustainer amplifier 218. This turns sustainer 400A on. S1D and therefore transducer M is disconnected from the input of pickup amplifier 206 by S2C. This means that low-impedance transducer M functions only as a pickup, and never as a sustainer driver. Terminal 3 of S1-A is connected to terminals 1 and 2 by S2B in the ON position. This makes bridge transducer B the selected pickup in positions 1, 2, 3 when the sustainer is on. It can be seen that slight re-wiring of S1A and S2B can change position 3 pickup selection from bridge transducer B to neck transducer N by disconnecting the C terminal of S2B from S1A terminals 1,2 and reconnecting to S1A terminals 4,5 if that is the preference of the musician by moving the ON position terminal of S2B from terminals 1,2 of S1A to terminals 4,5 of S1A.

The following two paragraphs describe how pickup selection determines driver selection when sustainer 400A is ON, making this a pickup-prioritized sustainer:

For switch S1 positions 1, 2, 3, bridge pickup transducer B is connected to the input of pickup amplifier 206 through S1A and S2B, and is therefore functioning as the instrument pickup. Transducer N is functioning as the sustainer driver transducer in positions 1, 2, 3 because it is connected to the output of sustainer amplifier 218 through S1B.

In positions 4 and 5 of pickup selector S1, transducer N is disconnected from the output of pickup amplifier 218 by S1B and connected to the input of pickup amplifier 206 by S1A and is thereby functioning as the instrument pickup. Transducer B is connected to the output of sustainer amplifier 218 by S1B and is now functioning as the sustainer driver. The switch transition from position 3 to position 4, or from position 4 to position 4 is extremely important and must be explained in some detail.

The asterisk (*) shown between contacts 3 and 4 of selector S1A, B, and C indicate that these contacts are made to be "non-shorting", so that common terminals Ca, Cb and Cc do not short respective terminals 3 and 4 together when switching between them. This is an undesirable state. It is undesirable because transducers B and N should not be simultaneously connected to the output of sustainer amplifier 218 and also to the input of pickup amplifier 206. It this happens, very loud popping sounds will be heard in the instrument amplifier because the output of sustainer amplifier 218 is briefly connected to the input of pickup amplifier 206. The ubiquitous "Superswitch" is constructed so that all adjacent contacts 1, 2, 3, 4, 5 are made as "shorting" type. In a conventional 3-pickup electric guitar, when the respective C contactor moves between adjacent contacts 1-2, 2-3 etc., pickup switching is quieter than if they were all non-shorting type. The Superswitch contacts indicated by the asterisk can be physically deformed so that they are changed to a non-shorting arrangement. This is rather tricky and labor-intensive, but it works to serve the desired purpose. Alternatively, a similar switch can be made so that all of the contacts are non-shorting configuration. This arrangement is less quiet for normal pickup switching, but it solves the problem of having transducers B and N being simultaneously connected to sustainer amplifier 218 output and pickup amplifier 206 input. Another solution would be to have a special switch made so that the terminals marked with the asterisk are manufactured to be non-shorting and the rest of the terminals shorting.

Pickup selector S1 sections can optionally have all shorting switch timing between terminals if provision is made to mute the instrument output signal during the switch positions between contacts 3 and 4. A fifth section S1E is shown with an output muting circuit comprising P-channel JFET Q1, diode D1, C1, R3 and R4. Shorting contacts 3 and 4 of section S1E quickly charges up C1 to +9 volts through low-value resistor R3. This quickly turns Q1 to the "off" (high-resistance) state, effectively muting the output signal during the brief time interval when transducer B or N might be connected to both the output of sustainer amplifier 218 and the input of pickup amplifier 206. The time to charge C1 should be quite short, about 100 microseconds to 1 millisecond, in order to quickly mute the instrument output during the transition between contacts 3 and 4. As the Ce contactor of section S1-E moves away from contact 3 or 4 to contact 2 or 5, respectively, C5 discharges relatively slowly through larger-value resistor R4. The resistance of R4 is chosen to mute the output signal for an appropriate period of time. This time should be about 50-200 milliseconds to ensure that magnetic fields of the active transducer B or N has sufficiently died so as not to create audible pops. Values for C1, R3, and R4 can be as follows, but not necessarily so: C1 can be approximately 0.033 uF; R3=preferably 1-10 K ohms, R4=approximately 1 or 2 megohms for C1=0.033 uF, or a similar time-constant. Typically, RC time constants are actually chosen empirically for low pop volume and as short a muting time as is consistent with good sound.

Switch section S1C connects to R1 and R2, which are preferably 1-10 ohms, to an internal amplifier for AGC (automatic gain control) purposes as described in U.S. Pat. No. 5,932,827. These resistors carry driver transducer current plus amplifier current pulses, which are amplified and integrated by the AGC circuit to control the sustainer amplifier gain, so that sustainer drive intensity builds up quickly and also tends to make most notes on the instrument have similar sustained vibration amplitude.

It was stated above that middle transducer M is not used as a sustainer driver in this embodiment, only as a pickup when the sustainer is in the standby state. It is also not used as a pickup whenever the sustainer is on, so it cannot furnish the input signal to the sustainer. There are two main reasons for this: (1) Middle pickups are generally quite close to the neck and bridge pickups (transducers). This increases the likelihood of excessive driver-to-pickup magnetic crosstalk, resulting in uncontrolled sustainer oscillation because of this close proximity. In this case, the sustainer amplifier gain must be decreased to stop the oscillation. This weakens the sustainer responsiveness, which compromises its usefulness. (2) Another reason that the middle transducer generally is not used as a sustainer driver or sustainer input signal pickup is related to the harmonic operating mode. In harmonic mode of an electromagnetic sustainer, the sustainer amplifier output phase is reversed. This forces the string vibration phase under the sustainer driver to be approximately 180 degrees (but not exactly, due to transducer phase shift) from the string vibration phase under the pickup transducer. This will be one of the natural harmonic vibration modes of the string. The closer this pickup-to-driver spacing is, the higher the string vibration harmonic will be. In general, lower harmonic modes ($2^{nd}$ harmonic, 3rd, $4^{th}$ etc.) sound more natural and pleasant than very high harmonics.

Middle transducer M of sustainer 400A can be wired to function as a driver transducer, or a pickup that provides a sustainer input signal even considering the above-mentioned disadvantages when doing this. This would allow the desirable bridge/middle pickup combination if the neck transducer is being used as the sustainer driver, or the also desirable neck/middle pickup combination if the bridge transducer is being used as the sustainer driver. Even though the sustainer performance will necessarily be somewhat compromised as described in the previous paragraph, this can easily be accomplished by simple switch connection. This is not specifically shown in any drawing, but straightforward to accomplish. If middle transducer M is to be used as a pickup when sustainer 400A is on, switch section S2C is deleted and terminal Cd of S1D is connected directly to the input of pickup amplifier 206.

S3 is a multi-position selector rotary switch having three sections and five positions. Its function is to provide multiple pickup sounds for the multi-driver sustainer. The switch shown has 5 positions, but it can be more or less. The switch type is preferably rotary or lever for 3-5 positions. It can be another arrangement of apparatus such as individual toggle or slide switches, or other apparatus. Section S3A has capacitors C2, C3, C4, C5 at terminals 1,2,3,4 respectively. Section S3B has resistors R5, R6, R7, and R8 at terminals 1,2,3,4 respectively. Typical resistor values are between 50 ohms and 1K ohms but not necessarily so. Typical capacitor values are between about 0.1 uF and 10 uF but not necessarily so. These recommended component values will produce a variety of different pickup sounds, two of which can be similar to prior art Sustainiac Stealth PRO that had similar selectable sounds resembling the Fender Stratocaster and Gibson Les Paul. Position 5 of S3 is shown with no capacitor or resistor attached. This will produce a frequency response that is essentially flat across the audio spectrum. Some players might find such a flat frequency response desirable.

Switch section S3C is configured with different resistor values R9, R10, R11, R12, R13 to change the gain of pickup amplifier 206 to provide different pickup volumes for positions 1-5 of S3 respectively. Many electric guitars having one or more humbucker pickups will have a "coil-tap" switch. This is used to disconnect or short out one of the two humbucker pickup coils to change the pickup sound to a bright single-coil sound. Typically, when actuating a coil-tap switch, the loss of one of the two series-connected humbucker coils causes the pickup output voltage to reduce by about 6 dB. This volume change can be realized by suitable pickup amplifier gain-setting resistors on S3C. It can also be desirable to have one or more of the pickup settings to have a pronounced gain change to provide guitar amplifier overdriving for a distorted tone, which is desirable for many players. No resistance values are shown for R9-13 because it is a totally subjective choice.

Three-section, five-position rotary pickup sound selector switch S3 will be shown on all subsequent embodiments of FIG. 4 and also FIG. 5 as a simple block in order to present uncluttered drawings. One wire of the block will be shown as connected to the input wire of pickup amplifier 206. The other wire of the block will be shown as connected to the outline of the amplifier symbol of 206 to show that this is the connection for a gain-setting resistor. Pickup amplifier 206 could be an op-amp or other type of amplifier.

Also, another active filter block will be shown on all subsequent embodiments as an option to sound selector S3, which can be used or not. The circuitry to accomplish this is not shown because there are numerous well-known filter types that can be incorporated to achieve instrument tonal variation. Second-order bandpass and also combinations of high-pass and low-pass active filters allow easy variation of resonance frequency and bandwidth, and can be manipulated to make interesting pickup sounds. These can also be manipulated to make unfamiliar but interesting pickup sounds. With multiple selectable active filter tone circuits, the frequency and phase response of the output signal varies with each filter response setting. But the frequency and phase response of the sustainer input signal remains constant because the input of active filter block is connected to the input of sustainer preamplifier 224, but not to the instrument output circuit comprising volume control 118, tone control 118, and output jack J1. The advantage of connecting active filters in this way is that having a constant frequency and phase response of the sustainer input signal, the sustained string vibration response can be optimized by equalizing the response of sustainer preamplifier 224. This optimized sustainer amplifier response stays constant for all active filter tone settings.

The pickup-prioritized sustainer described above and shown in FIG. 4A has an advantage over the prior art in that a musician can select the desired pickup in the normal way, and another transducer will be automatically selected as the sustainer driver. This advantage over all prior art electromagnetic sustainers is shared by all the FIG. 4 embodiments.

FIG. 4B AND FIG. 4C

DESCRIPTION

FIG. 4B depicts sustainer 400B having 3 low-impedance transducers B, N, and M, similar to FIG. 4A. This circuit accomplishes the pickup-prioritized functions of FIG. 4A with the exception that the amount of manual wiring labor of switch S1 is significantly reduced compared to FIG. 4A. This is accomplished by adding a second sustainer amplifier and sustainer preamplifier, which typically occupy a printed circuit board along with other sustainer 400B circuits. Sustainer amplifier 218B and sustainer preamp 224B are used to drive bridge transducer B. Transducer B is connected directly to the output of sustainer amplifier 218B. Sustainer amplifier 218N and sustainer preamp are associated with neck transducer N. Transducer N is connected directly to the output of sustainer amplifier 218-N. FIG. 4B again includes Power Supply Switch Circuit 216 and power supply 232 as shown in FIGS. 2B, 2D, 2G, 2H and all subsequent drawings of FIGS. 4 and 5. Pickup amplifier 206 is the same as for FIG. 4A. An output muting circuit comprises FET Q1, PNP transistors Q2, Q3, Resistors R13-R16, and C6. Pickup sound circuit S3 is similar to FIG. 4A, as is output jack J1, and volume/tone controls 118/201 respectively.

Switch S2 turns sustainer 400B ON and OFF as labelled for all sections S2A, S2B, and S2C. For the OFF position of S2B, connection of transducers B, M, and N is as follows: The top terminal of transducer B is connected to S2B common terminal C, S1B terminals 1 and 2, and to the output of B-SUST AMP 218B. The bottom terminal of transducer B is connected to the AGC-B terminal of B-SUST AMP 218B and to AGC resistor R1. The top terminal of transducer N is connected to S1B terminals 4 and 5, and to the output of N-SUST AMP 218N. The bottom terminal of transducer N is connected to the AGC-N terminal of N-SUST AMP and to AGC resistor R2. Transducer M is connected to the input of pickup amplifier 206 through S2C in positions 2, 3 and 4 of pickup selector section S1B.

Conventional lever-actuated rotary switches are generally hand-wired in electric guitars. In order to reduce the wiring complexity, a 3-section, 5-position lever-actuated rotary switch section shown in FIG. 4B can replace 4-section (or 5-section if pop-reduction circuit is included) of FIG. 4A.

FIG. 4C shows two time delay circuits that cause fast turn-off and slow turn-on of sustainer amplifiers for transducers B and N. These comprise time-delay RC networks R45 and C452 for N-transducer amplifier and a similar network for B-transducer amplifier. Charge/discharge currents are steered by diodes and inverters as shown.

FIG. 4B Operation

When sustainer 400B is in the OFF condition, transducers B and N are used as pickups only. The output level of transducers B and N are very low when used as pickups, less than 100 millivolts, even by employing very aggressive string-plucking technique. Amplifiers 218B and 218N are preferably class D, having high efficiency. The output transistors of amplifiers 218B and 218N are typically complimentary MOSFETs, and they have very high impedance in their OFF state. Each MOSFET has an intrinsic diode from source to drain terminal. The output level of transducers B and N as pickups is insufficient to cause the intrinsic diodes to conduct. The outputs of amplifiers 218N and 218B therefore appear to transducers N and B as very high impedance, producing negligible loading of the small amplitude pickup signal.

In position 1, pickup selector S1B selects bridge transducer B by connecting it to the input of pickup amplifier 206. Position 2 selects the combination of bridge transducer B and middle transducer M by S1B and S1C respectively. Position 3 selects middle transducer M by S1C. Position 4 selects the combination of middle transducer M and neck transducer N by S1C and S1B respectively. Position 5 selects neck transducer N by S1B.

As with sustainer 400A, sustainer 400B is turned ON by placing all S2 sections into the ON position. Transducer M is disconnected from the input to pickup amplifier 206 by S2C in the ON position. S2B connects transducer B to the input of pickup amplifier 206 in position 3 of selector S1B when sustainer 400B is ON. Alternatively, S2B could be disconnected from S1B terminals 1, 2 and reconnected to S1B terminals 4,5. In this case transducer N is connected to pickup amplifier 206 input through S2B in position 3 of selector S1B. The choice for this particular connection depends on the player preference for neck pickup or bridge pickup, as many players have a preference for one or the other.

In positions 1, 2 and 3 of selector S1, terminal N of power supply 216 is connected to ground through S1A and S2A. This causes +9 volts from the +9V RUN-N supply terminal 220N to be applied to N-Preamp 224-N. N-SUST AMP 218-N is activated to the ON state by this sequence of actions. Transducer N functions as the sustainer driver, and transducer B functions as the instrument pickup.

In positions 4 and 5 of selector S1, terminal B of power supply 216 is connected to ground through S2A and S1A. This applies +9 volts from the +9V RUN-B supply terminal 220B to B-Preamp 224-B. B-SUST AMP 218-B is activated to the ON state by this sequence of actions. Transducer B functions as the sustainer driver, and transducer N functions as the instrument pickup.

If switch section S2B is re-wired to connect S1B terminal 3 to terminals 4 and 5 instead of 1 and 2 as shown, then in position 3 of S1, transducer N functions as the instrument pickup and transducer B functions as the sustainer driver.

As previously discussed, common pickup selectors such as S1 typically have "make-before-break" switch timing, also called "shorting" type. As contactor terminal C of each section moves from positions 1 to position 2, and from 2 to 1 or 2 to 3, etc., the contactor momentarily shorts the adjacent terminals together. This is done to reduce the tendency for popping sounds between contacts as instrument pickups are selected and deselected.

When transitioning from position 3 to 4, with sustainer 400B in the ON state, the sustainer driver transducer selection changes from N to B. Conversely when transitioning from position 4 to 3, the sustainer driver transducer selection changes from B to N. For make-before-break selector switch timing, for a brief period of time during the 3-to-4 or 4-to-3 switch position transition, both sustainer amplifiers 218B and 218N are simultaneously turned on and connected to transducers. Also, during these transitions, sustainer amplifier outputs are simultaneously applied to the input of pickup amplifier 206. This is an unacceptable condition because it causes loud "pop" sounds to be heard in the instrument amplifier.

There are several ways to resolve this undesirable condition.
1. Use a selector switch with non-shorting switch timing so that both sustainer amplifiers are never simultaneously turned on, and accept the small pop sounds that occur when changing switch positions when the sustainer is OFF.
2. Use the common selector switches with shorting switch timing, but physically bend the position 3 and 4 terminals away from each other so that these 2 terminals have non-shorting timing (indicated by asterisk * on S1A and S1B).
3. Use a pickup selector switch based on printed circuit board technology, where all terminals are shorting except for position 3 and 4.
4. Use time-delay circuits for slow turn-on of both sustainer amplifiers 218B and 218N, and for fast turn-off of both. FIG. 4C shows a detailed example of such a circuit that could be connected to power supply switch 216 of FIG. 4B. When terminal N is connected to ground in S1 switch positions 1, 2, or 3, inverter 450 A output switches to a high state. This charges C452 through resistor R454. When a predetermined voltage level is reached after a predetermined time-delay set by R454 and C452, the output of U450B switches from high to low state, thereby turning on PNP transistor Q458 by placing R466 at ground potential at the output of inverter 450B. The collector of Q468 is connected to terminal 220N of FIG. 4D. This activates N-Preamp 224-N, which then activates N-Sust Amp 218-N of FIG. 4B. When selector switch S1A switches from terminal 3 to terminal 4, the output state of inverter 450A changes from high to low as its input is connected to +9 volts through R462. Capacitor C452 rapidly discharges through diode D456, quickly deactivating N-Sust Amp 218N. Then B-Sust Amp 218-B is activated after a similar time delay using an identical time-delay circuit as shown. The collector of the unlabeled transistor is connected to terminal 220B of FIG. 4D. This slow turn-on and fast turn-off of the sustainer output amplifiers ensures that both sustainer amplifiers are off during the transition of pickup selector switch S1 from position 3 to 4 or from position 4 to 3, thereby preventing loud, annoying pops.
5. Place a muting circuit between the output of pickup amplifier 206 and instrument output that is quickly activated during the time when both N and B inputs of power supply 216 are connected to ground by selector S1A.

Transistors Q1, Q2, Q3 and associated circuitry comprise a muting circuit as mentioned in item #5 immediately above. PNP transistors Q2, Q3 and respective base resistors R13 and R14 comprise a simple AND logic circuit. When contactor Ca of S1A momentarily connects both terminals 3 and 4 to ground during the transition from position 3 to position 4 (or vice-versa), both Q1 and Q2 are quickly placed into a momentary conducting state, which quickly places P-channel field effect transistor Q1 into a high impedance state. This effectively mutes the output of pickup amplifier 206. R15 and C6 values are chosen so that C1 charges to +9 volts within a few microseconds.

After contactor Ca of S1A settles onto either terminal #3 or #4 of S1A, Q3 or Q2 respectively turn OFF, which allows Q1 to turn ON after capacitor C6 discharges through resistor R16. Resistor R16 value is chosen to allow ample time for muting to allow everything to settle in order to eliminate unacceptable popping sounds, but not so long as to mute the output for an excessive amount of time. The acceptable amount of time can be set by a subjective judgement decision.

S3 is the pickup sound switch that has been previously described and is shown in all FIGS. 4 and 5. Block 410 is the pickup sound switch with active filter technology that has been previously described and is shown in all FIGS. 4 and 5.

FIG. 4D
Description
FIG. 4D depicts a schematic of a stringed musical instrument that contains sustainer 400D, including two transducers B and N and the prior-art sustainer components described in FIG. 2. This embodiment also has pickup-prioritized driver selection. It is much like that of FIG. 4B sustainer 400B except that there is no middle pickup position transducer M. Consequently, ON/OFF switch S2 has two sections instead of 3.

Pickup selector switch S1 can be a 3-position lever-actuated rotary switch having 4 sections, with 2 sections per wafer, similar to the 3-position, 2-section (single-wafer) "CRL" switch used by Fender and many other guitar manufacturers.

FIG. 4D Operation
Pickup selector S1 functions in the normal way for a 2-pickup stringed instrument when sustainer 400D is OFF. S1 position #1 selects bridge pickup B, position #2 selects both bridge pickup B and also neck pickup N, and position #3 selects neck pickup N.

When sustainer 400D is turned ON by S2, sustainer amplifier 218 drives transducer N for S1 positions 1 and 2, and transducer B for S1 position 3. S1C connects AGC resistors R1 and R2 to the AGC terminal of amplifier 218 in a similar manner to FIG. 4B. For positions 1 and 2 transducer B is selected as the instrument pickup, and for position 3, transducer N is selected as the pickup.

Alternatively, S1 can be rewired so that transducer N is selected as the pickup for positions 2 and 3, making transducer B the sustainer driver in those positions. It is a choice for the musician.

S3 is the pickup sound switch that has been previously described and is shown in all FIGS. 4 and 5. Block 410 is the pickup sound switch with active filter technology that has been previously described and is shown in all FIGS. 4 and 5.

FIG. 4E
Description
Pickup-prioritized sustainer 400E has two transducers B and N, and two sustainer preamplifiers 224B and 224N, and sustainer amplifiers 218B and 218N similar to sustainer 400B. Also, sustainer ON/OFF function is accomplished by S2A, similar to sustainer 400B. Most of the other sustainer components are as described in FIG. 4B, including pop-muting transistors Q1, Q2, Q3 and associated components. The significant difference between sustainer 400E and sustainer 400B is that sustainer 400E has two low impedance transducers instead of three.

Operation
When switch S2 is switched to the OFF position, sustainer 400E is placed into the OFF state by switch section S2A. One or both of the two transducers B or N is connected to the input of pickup amplifier 206 by S1C and S1B respectively.

When switch S2 is switched to the ON position, sustainer 400E is placed into the ON state by switch section S2A. One of the two transducers B or N is connected to the input of pickup amplifier 206 by S1C and S1B respectively, that transducer being the selected pickup. The sustainer preamp and sustainer amplifier of the other transducer is turned on by connecting either terminal N or terminal B of Power switch 216 to ground by S1A and S2A, making that transducer the sustainer driver. When selector S1 is in position 1, bridge transducer B is connected to the input of pickup amplifier 206 by switch section S1B and therefore becomes the selected pickup. Neck transducer preamplifier 224N is turned on by S1A, when S1A connects terminal N of power switch 216 to ground. Sustainer amplifier 218B and sustainer Preamp 224B are disabled by S1A.

In position 2 of pickup selector S1, transducer B is still connected to the input of pickup amplifier 206 and transducer N is still functioning as the sustainer driver because of the wiring of S1C and the connection of S2B.

In position 3 of selector S1, the connections are reversed and bridge transducer B becomes the sustainer driver, and transducer N becomes the pickup. In middle position 2 of selector S1, transducer N is prevented from being connected to the input of pickup amplifier 206 by switch section S2B in the ON position. Therefore, only bridge transducer B is connected to pickup amplifier input 206 in positions 1 and 2 when the sustainer switch S1 is in the ON position and sustainer amplifier 218N and N-Preamp 224N are both energized in both positions 1 and 2 by S1A. For players who prefer the sound of the neck pickup over the sound of the bridge pickup, this selection can be reversed by re-arranging the connection of S2B (not shown) and also moving the jumper between terminals 1 and 2 of S1A to terminals 2 and 3. In this case transducer N will be selected as the pickup for position 2 of selector S1 when sustainer 402 is in the on state.

Pop-muting options are similar to that of FIG. 4B and won't be described in detail again. Pickup sound selector switch circuit S3 or active filter block 410 provide pickup sound options.

FIGS. 5A-5E show an alternative way to configure a sustainer having 2 or 3 low impedance transducers. The FIGS. 5A-5E have driver-prioritized selection of the sustainer driver. The hookup schemes in the instrument tend to be less complex than for the pickup-prioritized schemes of the FIG. 4 drawings.

FIG. 5A-5E all include Power Supply Switch Circuit 216 as shown in FIGS. 2B, 2D, 2G, and FIG. 4 drawings, also similar instrument controls and output jack J1. Inserting a common monaural guitar plug into output jack J1 places sustainer 500A into standby state if ON-OFF switch S2 is in the OFF position.

FIG. 5A

Description

Three-driver sustainer 500A of FIG. 5A shows a standard 2-section, 5-position "CRL-type" pickup selector S1 having shorting contact timing. This type of pickup selector switch is well-known in the art and commonly available. It has been the standard Fender Stratocaster pickup selector and also for many similar guitars for decades. Because it only has 2 sections instead of the 5 sections of switch S1 of FIG. 4A, it is simpler and easier to wire. Like the Stratocaster, section S1B is used for choosing neck/middle tone controls TONE 1 and TONE 2 respectively in this diagram, which share rolloff capacitor C7. Another volume/tone arrangement could be shown instead of this one. But this arrangement is popular with many Stratocaster players. Switches S2 and S3 are 2-position switches, having 4-poles and 3-poles, respectively, and have non-shorting timing characteristic. They can be common toggle or slide switches or other type. Furthermore, these switches allow much of the assembly of sustainer circuit 500A to be mounted to a printed circuit board, substantially reducing assembly labor of the sustainer. S2 is the ON-OFF switch for sustainer 500A.

S3 is the pickup sound switch that has been previously described and is shown in all FIGS. 4 and 5. Block 410 is the pickup sound switch with active filter technology that has been previously described and is shown in all FIGS. 4 and 5.

Operation

With S2 in the OFF position, pickup selection is straightforward and typical of guitars having three pickups. In position 1 of selector S1, bridge transducer B is connected to the input of pickup amplifier 206 by S1A, through S2C and S2B. Further rotating contactors Ca and Cb of S1A and S1B to position 2, adjacent contacts 1 and 3 of both sections are shorted to each other because of the width of the rotating contactor. In switch S1A position 2, bridge transducer B and also middle transducer M are connected to the input of pickup amplifier 206. In position 3 of selector S1, middle transducer M (only) is connected to the input of pickup amplifier 206. In position 4 of selector S1A, both middle transducer M and also neck transducer N are connected to the input of pickup amplifier 206. In position 5 of selector S1, neck transducer N only is connected to the input of pickup amplifier 206. These five positions of pickup selector S1 produce the common pickup selections of many electric guitars that have 3 pickups, including the Fender Stratocaster.

Sustainer 500A is turned to the ON state when switch S2 is in the ON position. Switch section S2A activates power supply 216, which activates sustainer preamplifier 224, which then activates sustainer amplifier 218 as with the embodiments of FIG. 4. Pickup selector section S1A is bypassed in the ON position of S2. This means that transducer M is disabled whenever sustainer 500A is ON.

Driver select switch S4 selects either transducer B or transducer N to function as the sustainer driver depending on whether it is set to the B position or the N position respectively. If transducer B is selected by S4, then it is connected to the output of sustainer amplifier 218 by S2C and S4A. Simultaneously S4C connects R1 (preferably 1-10 ohms) to the AGC input of sustainer amplifier 218. In this case transducer N is connected to the input of pickup amplifier 206 through S2D, S4B and S2B, regardless of the position of disabled pickup selector S1.

If transducer N is selected as driver by S4, then it is connected to the output of sustainer amplifier 218 through S2D and S4B. Simultaneously S4C connects R2 (preferably 1-10 ohms) to the AGC input of sustainer amplifier 218. In this case, transducer B is connected to the input of pickup amplifier 206 through S2C, S4A and S2B regardless of the position of pickup selector S1.

FIG. 5B

FIG. 5B shows an alternative way to configure a sustainer having 2 low impedance electromagnetic transducers and driver-prioritized selection of the sustainer driver.

Description

Two-driver sustainer 500B of FIG. 5B uses commonly-available parts. A standard 2-section, 3-position "CRL-type" pickup selector S1 with shorting switch timing is shown. This type of pickup selector switch is well-known in the art and commonly available. Switches S2 and S4 are both 2-position toggle (or slide, etc.) switches having 4 and 3 sections, respectively. These are also commonly available on the market. Furthermore, these switches allow much of the assembly of sustainer circuit 500B to be mounted to a printed circuit board, greatly reducing hand assembly labor of the sustainer.

S3 is the pickup sound switch that has been previously described and is shown in all FIGS. 4 and 5. Block 410 is the pickup sound switch with active filter technology that has been previously described and is shown in all FIGS. 4 and 5.

Operation

When sustainer 500B is placed into the standby state by placing ON-OFF switch S2 into the OFF position, pickup selection is straightforward and typical of guitars having two pickups and a 3-position pickup selector switch. Rotating contactors Ca and Cb of S1-A and S1B respectively are connected together electrically by S2C in the OFF position. In position 1 of selector S1, bridge position transducer B is connected to the input of pickup amplifier 206. In switch position 2 of selector S1, bridge position transducer B and also neck position transducer M are connected to the input of pickup amplifier 206. In position 3 of selector S1, neck transducer N is connected to the input of pickup amplifier 206. These three positions of pickup selector S1 produce the common pickup selections of most electric guitars that have 2 pickups.

Sustainer 500B is turned to the on state when switch S2 is in the ON position. Switch section S2A activates sustainer amplifier 218 as described throughout the application. Switch sections S2B, S2C and S2D bypass pickup selector S1, taking S1 out of the circuit.

Switch S4 selects either transducer B or transducer N to function as the sustainer driver depending on whether it is set to the B position or the N position respectively. If transducer B is selected by S4, then it is connected to the output of sustainer amplifier 218 by section S4B. Simultaneously S4C connects R1 (preferably 1-10 ohms) to the AGC input of sustainer amplifier 218. In this case transducer N is connected to the input of pickup amplifier 206 through S4A and S2D regardless of the position of pickup selector S1 because S1 is bypassed.

If transducer N is selected as driver by S4, then it is connected to the output of sustainer amplifier 218 by S4B. In this case transducer B is connected to the input of pickup amplifier 206 through S4A and S2B regardless of the position of pickup selector S1. Simultaneously S4C connects R2 (preferably 1-10 ohms) to the AGC input of sustainer amplifier 218.

S3 is the pickup sound switch that has been previously described and is shown in all FIGS. 4 and 5. Block 410 is the pickup sound switch with active filter technology that has been previously described and is shown in all FIGS. 4 and 5.

FIG. 5C

FIG. 5C shows sustainer 500C for an instrument having three electromagnetic transducers B, M, and N.

Description

FIG. 5C is similar to sustainer 500A of FIG. 5A with two exceptions: (1) Pickup selector S1 has been replaced by individual pickup selector switches S5, S6, and S7. The common terminals of these three switches are connected together. (2) The two tone controls of FIG. 5A have been replaced by a master tone control.

Operation

Individual pickup selector switches S5, S6, S7 are bypassed when sustainer 500C is turned ON, in a similar manner to S1 of sustainer 500A of FIG. 5A. This configuration is shown because many electric guitars use individual pickup selector switches. Pickup selector switches S5, S6, and S7 are most commonly of the toggle type, but other types can be used such as slide switches etc. Pickup selector switches S5, S6, and S7 select transducers B, M, and N, respectively.

Switch S4D connects either neck transducer N or bridge transducer B to the output of sustainer amplifier 218.

It can be easily seen that middle transducer M and switch section S6 can be removed, which would be the configuration for an instrument having two transducers.

S3 is the pickup sound switch that has been previously described and is shown in all FIGS. 4 and 5. Block 410 is the pickup sound switch with active filter technology that has been previously described and is shown in all FIGS. 4 and 5.

FIG. 5D

Description

FIG. 5D shows sustainer 500D for an instrument having two electromagnetic transducers B and N. FIG. 5D is similar to sustainer 500B of FIG. 5B with one exception: Lever-type 2-section pickup selector S1 has been replaced by 3-position toggle selector switch S6. This switch is very commonly used for 2-pickup guitars such as the Gibson Les Paul and similar guitars having 2 pickups. Previously-described sustainer and pickup amplifier circuitry are present as for all shown embodiments. Optional multiple pickup sound switch S3 is shown simply in block form since its function has been previously discussed, as is active filter block 410. Driver select switch S4 selects pickup and driver function when sustainer 500D is on.

Operation

When sustainer 500D is off, pickup selection is normal for a 2-pickup guitar with a 3-position toggle switch, with the middle position producing a blend of neck and bridge pickup transducers. Selector switch S6 is bypassed when sustainer 500D is turned ON, by S2 sections B, C, D. Driver select switch S4 connects the input of pickup amplifier 206 to either transducer B or N, while simultaneously connecting the output of sustainer amplifier 218 to N or B respectively.

S3 is the pickup sound switch that has been previously described and is shown in all FIGS. 4 and 5. Block 410 is the pickup sound switch with active filter technology that has been previously described and is shown in all FIGS. 4 and 5.

FIG. 5E

Description

Sustainer 500E of FIG. 5E shows a simple arrangement of a 2-transducer instrument. It has one selector switch S8 that functions as both the pickup selector and also driver selector, in addition to previously-described pickup and sustainer amplifiers and power supply switching circuitry.

S3 is the pickup sound switch that has been previously described and is shown in all FIGS. 4 and 5. Block 410 is the pickup sound switch with active filter technology that has been previously described and is shown in all FIGS. 4 and 5.

Operation

When single-pole switch S2 is in the OFF position, sustainer 500E is turned off. In either the B or N position of S8, one transducer is connected to sustainer amplifier 218 output and the other transducer is connected to the input of pickup amplifier 206. Pickup selector S3 can select either transducer B or N as the instrument pickup, but not both at once. Many guitar players prefer the two sounds of bridge pickup only and neck pickup only, and rarely use the blend of both pickups. For such players this arrangement is desirable because the entire arrangement is simple. S8 must be of the break-before-make switch timing characteristic in order to eliminate the inevitable pop-sounds that occur if a transducer is connected to both the input to pickup amplifier 206 and the output of sustainer amplifier 218.

CONCLUSION

The pickup-prioritized multi-driver sustainer is easier to use for the player than the driver-prioritized multi-driver sustainer. This is because when the bridge pickup is selected, the neck pickup automatically becomes the sustainer driver transducer. Vice-versa for neck pickup selection. But the tradeoff is that it is more complicated to assemble. For pickup-prioritized multi-transducer sustainers, the pickup selector switch design is generally more complicated with more wiring connections than with the driver-prioritized design. The driver-prioritized sustainers are less complicated to assemble, in that standard switches that are used in the production of most 2-pickup and 3-pickup stringed instruments are used. The tradeoff is that there is a driver transducer selector and also a pickup selector, making the driver-prioritized sustainer harder to use for the player than the pickup-prioritized sustainer.

It was also found that by increasing the number of sustainer output amplifiers and preamps from one to two, switch wiring complexity of the pickup-prioritized multi-transducers can be substantially reduced. Since the output amplifiers and preamplifiers can be constructed using inexpensive printed circuit technology, this is a desirable option.

What is claimed is:

1. A pickup-prioritized electromagnetic sustainer for an electric stringed musical instrument, wherein the strings of said instrument are stretched between an instrument bridge and a headstock at the end of the instrument neck, wherein said instrument has two low impedance electromagnetic low impedance electromagnetic transducers, wound with several hundred turns of wire, that function as string vibration pickups when said sustainer is placed into a standby state, wherein said low impedance electromagnetic transducers sense the vibrations of said strings and produce an audio signal voltage in response to said vibrations, and wherein a first said low impedance electromagnetic transducer is disposed near said instrument bridge and is called a bridge transducer, and wherein a second said transducer is disposed near said instrument neck and is called a neck transducer, wherein said instrument has an instrument output for said audio signal, said sustainer comprising:
   a. a dc power supply,
   b. a sustainer on-off switch,
   c. a pickup amplifier having an input and an output, powered by said power supply,
   d. a sustainer amplifier having an input and an output, powered by said power supply,
   e. a pickup selector means that selects said bridge transducer in a first setting, or said neck transducer in a second setting or both said low impedance electromagnetic transducers simultaneously in a third setting, and applies said audio signals of said low impedance electromagnetic transducers to said pickup amplifier input,
   f. wherein if said sustainer on-off switch is turned off, said sustainer is placed into a standby state, whereby said pickup amplifier is connected to said power supply but said sustainer amplifier is disconnected from said power supply,
   g. wherein if said sustainer amplifier is turned on by said sustainer on-off switch, said sustainer amplifier is connected to said power supply, thereby activating said sustainer amplifier,
   h. wherein said output of said pickup amplifier connects to said input of said sustainer amplifier and also connects to said instrument output,
   i. whereby multiple desirable pickup sounds are produced when said first, second, or third positions of said pickup selector means are selected while said sustainer is in said standby state,
   j. and whereby the blend sound of said third position of said pickup selector means is more desirable than if one of said bridge or neck low impedance electromagnetic transducers is a typical high impedance passive pickup wound with several thousand turns of wire,
   k. and wherein if said sustainer on-off switch is turned on, said sustainer is placed into sustainer on state and said sustainer amplifier is connected to said power supply,
   l. wherein if said neck transducer is connected to said input of said pickup amplifier by said selector means, causing said neck transducer to function as said instrument pickup, then said bridge transducer is simultaneously connected by said selector means to said output of said sustainer amplifier, causing it to function as a said sustainer driver, whereby infinite sustain of string vibrations is produced by the pulsating magnetic field emanated by said bridge transducer in response to said output signal from said transducer amplifier,
   m. and wherein if said bridge transducer is connected to said input of said pickup amplifier by said selector means, causing said bridge transducer to function as a said pickup, then said neck transducer is simultaneously connected by said selector to said output of said sustainer amplifier, causing it to function as a said sustainer driver, whereby infinite sustain of string vibrations is produced by the pulsating magnetic field emanated by said neck transducer in response to said output signal from said transducer amplifier,
   n. whereby said sustainer functions in a robust fashion when powered by a common 9-volt battery or other low-voltage power supply or battery because of said low impedance of said electromagnetic low impedance electromagnetic transducers.

2. The sustainer of claim 1, wherein said sustainer is placed in said on state and said selector means is placed in said third position, said selector means hookup is arranged such that either said bridge transducer is connected to said input of said pickup amplifier, and said neck transducer is connected to said output of said sustainer amplifier, or optionally said neck transducer is connected to said input of said pickup amplifier and said bridge pickup is connected to said sustainer amplifier depending upon the preference of the player of said instrument.

3. The sustainer of claim 1,
   a. wherein said bridge transducer is constructed as a common rail type, comprising two magnetic polepieces made of steel or other magnetic material, each said polepiece spanning across all the strings of said instrument, with said two polepieces disposed next to each other and wound with several hundred turns of wire, with a permanent magnet disposed such that the magnetic north-seeking pole of said magnet spans the entire length of one said polepiece and is attached to it, preferably disposed below said coil that is wound around said polepiece, and the magnetic south-seeking polepiece of said magnet spans the length of the other entire said polepiece, preferably positioned below said coil that is wound around the second said polepiece, such that both polepieces emanate magnetic fields that impinge on said instrument strings, attracting them toward said polepieces, with said wire coils connected preferably in parallel but not necessarily, polarized such that when a current of one polarity from said output of said sustainer amplifier passes through said coils, both said north and south seeking magnetic flux emanated by said polepieces toward said instrument strings increases in amplitude, and when an oppositely-polarized said current passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said rail type construction functions as a hum-cancelling pickup, b. and wherein a said second of said two low impedance electromagnetic transducers is of the bilateral type, also comprising two polepieces wound with wire, wherein each said polepiece is magnetized with a permanent magnet disposed preferably at the bottom of each said polepiece, one said polepiece being magnetized with north-seeking polarity, the other said polepiece being magnetized with south-seeking polarity, each said coil-polepiece assembly disposed approximately halfway across said span of instrument strings, such that one said polepiece radiates north-seeking magnetic flux toward approximately half of said strings, and the other said polepiece radiates south-seeking magnetic flux toward approximately the other half of said strings, wherein said coils are connected preferably in parallel, polarized such that when a current of one polarity passes through said coils, both said north and south seeking magnetic flux emanated by said polepieces toward said instrument strings increase in amplitude, and when a current of opposite polarity passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said bilateral type construction functions as a hum-cancelling pickup.

4. The sustainer of claim 1, wherein an adjustable pickup sound selector means selects different valued capacitors and resistors in parallel with said input of said pickup amplifier in order to produce multiple pickup resonance frequencies and bandwidths in the audio frequency range, exceeding two said multiple selected pickup resonance frequencies and bandwidths, wherein said sound selector means produces a plurality of pickup sounds.

5. The sustainer of claim 1, wherein an adjustable active filter pickup sound apparatus is arranged to produce multiple pickup resonance frequencies and bandwidths, wherein said active filter arrangement is placed between said output of said pickup amplifier and said instrument output, and wherein the output of said active filter does not connect to said input of said sustainer amplifier, whereby said adjustable frequencies and bandwidths do not affect the frequency response of said sustainer amplifier signal.

6. The sustainer of claim 1, wherein said stringed musical instrument has a middle transducer disposed between said bridge and neck low impedance electromagnetic transducers, wherein said middle transducer functions only as an pickup when selected by said pickup selector means, and wherein said middle transducer is disconnected from said pickup selector when said sustainer is placed into said on state by said on-off switch and replaced by either said bridge transducer or said neck transducer depending on the personal preference of the musician.

7. The sustainer of claim 1 connected in a driver-prioritized configuration, wherein said selector means functions as a pickup-selector only when said sustainer is in said standby state by placing said on-off switch in the off position, and when said on-off switch is placed in the on-position, said selector means is bypassed, wherein a driver selector means selects the sustainer transducer that is desired to be the sustainer driver, by connecting it to said output of said sustainer amplifier, wherein if said driver selector means is placed in a position to select a desired said transducer to function as a said driver, said driver selector means will simultaneously select the other said transducer that will function as a said pickup for said sustainer, wherein said transducer that functions as said pickup is of bilateral design and said transducer that functions as said driver is of rail-type design or vice-versa.

8. The sustainer of claim 1, having two sustainer amplifiers, wherein said bridge transducer is connected to the output of a first sustainer amplifier and said neck transducer is connected to the output of a second sustainer amplifier, wherein if a said first or second sustainer amplifier is in an off state, the said output of said first or second sustainer in said off-state is high impedance and therefore loads said connected transducer negligibly, and wherein if said selector means selects said bridge transducer as a said pickup by connecting it to said pickup amplifier input, then said neck transducer functions as a said driver for said sustainer because said selector means turns second sustainer amplifier on, and wherein if said selector means selects said neck transducer as a said pickup by connecting it to said pickup amplifier input, then said bridge transducer functions as a said driver for said sustainer because said selector means turns first sustainer amplifier on and simultaneously turns said second sustainer amplifier off, whereby the use of two said sustainer amplifiers simplifies the wiring of said selector means.

9. A driver-prioritized electromagnetic sustainer for an electric stringed musical instrument, wherein the strings of said instrument are stretched between an instrument bridge and a headstock at the end of the instrument neck, wherein said instrument has three low impedance electromagnetic low impedance electromagnetic transducers that can function as pickups that sense the vibrations of said strings and produce an audio signal voltage in response to said vibrations, wherein a first said transducer is disposed near said instrument bridge and is called a bridge transducer, and wherein a second said transducer is disposed near said instrument neck and is called a neck transducer, and wherein a third transducer is disposed in between said bridge and neck low impedance electromagnetic transducers and is called a middle transducer, wherein said instrument has an instrument output, said sustainer comprising:

a. a sustainer on-off switch for turning said sustainer off and on, b. a pickup amplifier having an input and an output, c. a sustainer amplifier having an input and an output, d. wherein if said sustainer on-off switch is in an off-position, said driver-prioritized electromagnetic sustainer is in a standby state, e. wherein a pickup selector means selects said neck transducer singly, or a blend of said neck and said middle low impedance electromagnetic transducers, or said middle transducer, or a blend of said middle and bridge low impedance electromagnetic transducers, or said bridge transducer singly, and connects said audio voltage of selected said low impedance electromagnetic transducers to said input of said pickup amplifier, wherein said selected transducer or said blend of said low impedance electromagnetic transducers function as pickups of said instrument, f. wherein said output of said pickup amplifier connects to said input of said sustainer amplifier and also connects to said instrument output, g. wherein if said sustainer on-off switch is in an on-position, said pickup selector is disconnected, and also said middle transducer is disconnected, h. and wherein a driver selector means having two positions is connected, i. wherein a first position of said driver selector selects said bridge transducer that functions as sustainer driver transducer or in a second position said driver selector selects said neck transducer that functions as sustainer driver transducer, j. wherein a said transducer that is not selected by said driver selector means to function as a said sustainer driver transducer is selected by said driver selector means to function as said pickup transducer of said instrument, k. whereby said sustainer with said multiple low impedance electromagnetic transducers will produce infinite sustain of the string vibrations of said instrument and also provide multiple pickup sounds at said instrument output as the functions of said low impedance electromagnetic transducers are changed from pickup to driver and vice-versa by said driver selector, l. whereby said sustainer functions in a robust fashion when powered by a common 9-volt battery or other low-voltage power supply or battery because of said low impedance of said electromagnetic low impedance electromagnetic transducers.

10. The sustainer of claim 9, wherein an adjustable pickup sound selector means is arranged to switch different valued capacitors and resistors in parallel with said input of said pickup amplifier in order to produce multiple pickup resonance frequencies and bandwidths exceeding two said multiple selected pickup resonance frequencies and bandwidths, wherein one selector setting optionally has no said capacitor or resistor so that a flat audio response is produced.

11. The sustainer of claim 9, wherein an adjustable pickup sound selector means is arranged to change the gain of said pickup amplifier to produce pickup sounds with different output amplitudes.

12. The sustainer of claim 9,
a. wherein no said middle transducer is disposed between said neck and bridge low impedance electromagnetic transducers,
b. wherein if said sustainer is placed into a standby state by said sustainer on-off switch being placed in said off position, said pickup selector means can select said bridge transducer or a blend of said bridge and neck low impedance electromagnetic transducers or said neck transducer,
c. wherein if said sustainer is activated by said on-off switch being placed in said on position, said pickup selector switch is bypassed and said driver selector selects either neck transducer or said bridge transducer as sustainer driver transducer,
d. wherein if said driver selector means selects said neck transducer as sustainer driver, then said bridge transducer functions as said instrument pickup,
e. and wherein if said driver selector selects said bridge transducer as sustainer driver, then said neck transducer functions as said instrument pickup,
f. whereby said sustainer with said two low impedance electromagnetic transducers will produce infinite sustain of the string vibrations of said instrument and also provide multiple pickup sounds at said instrument output as the functions of said low impedance electromagnetic transducers are changed from pickup to driver and vice-versa by said driver selector,
g. and whereby said sustainer functions in a robust fashion when powered by a common 9-volt battery or other low-voltage power supply or battery because of said low impedance of said electromagnetic low impedance electromagnetic transducers.

13. The sustainer of claim 9,
a. wherein said bridge transducer is constructed as a common rail type, comprising two magnetic polepieces made of steel or other magnetic material, each said polepiece spanning across all the strings of said instrument, with said two polepieces disposed next to each other and wound with several hundred turns of wire, with a permanent magnet disposed such that the magnetic north-seeking pole of said magnet spans the entire length of one said polepiece and is attached to it, preferably disposed below said coil that is wound around said polepiece, and the magnetic south-seeking polepiece of said magnet spans the length of the other entire said polepiece, preferably positioned below said coil that is wound around the second said polepiece, such that both polepieces emanate magnetic fields that impinge on said instrument strings, attracting them toward said polepieces, with said wire coils connected preferably in parallel but not necessarily, polarized such that when a current of one polarity from said output of said sustainer amplifier passes through said coils, both said north and south seeking magnetic flux emanated by said polepieces toward said instrument strings increases in amplitude, and when an oppositely-polarized said current passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said rail type construction functions as a hum-cancelling pickup,
b. and wherein a said second of said two low impedance electromagnetic transducers is of the bilateral type, also comprising two polepieces wound with wire, wherein each said polepiece is magnetized with a permanent magnet disposed preferably at the bottom of each said polepiece, one said polepiece being magnetized with north-seeking polarity, the other said polepiece being magnetized with south-seeking polarity, each said coil-polepiece assembly disposed approximately halfway across said span of instrument strings, such that one said polepiece radiates north-seeking magnetic flux toward approximately half of said strings, and the other said polepiece radiates south-seeking magnetic flux toward approximately the other half of said strings, wherein said coils are connected preferably in parallel, polarized such that when a current of one polarity passes through said coils, both said north and south seeking magnetic flux emanated by said polepieces toward said instrument strings increase in amplitude, and when a current of opposite polarity passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said bilateral type construction functions as a hum-cancelling pickup.

14. A driver-prioritized electromagnetic sustainer for an electric stringed musical instrument, hereinafter called instrument, wherein the strings of said instrument are stretched between an instrument bridge and a headstock at the end of the instrument neck, wherein said instrument has two low impedance electromagnetic transducers that function as pickups that sense the vibrations of said strings and produce an audio signal voltage in response to said vibrations, wherein a first said low impedance electromagnetic transducer is disposed near said instrument bridge and is called a bridge transducer, and a second said low impedance electromagnetic transducer is disposed near said instrument neck and is called a neck transducer, wherein said instrument has an instrument output, said sustainer comprising:

a. a sustainer on-off switch having an on position and an off position for turning said sustainer on and off,
  b. a pickup amplifier having an input and an output,
  c. a sustainer amplifier having an input and an output,
  d. wherein said output of said pickup amplifier connects to said input of said sustainer amplifier and also connects to said instrument output,
  e. a transducer selector means that selects either said bridge transducer or said neck transducer to the input of said pickup amplifier, wherein said pickup amplifier output is connected to said instrument output and also to said input of said sustainer amplifier,
  f. wherein if said sustainer on-off switch is in said on position, if said bridge transducer is connected to said pickup amplifier input, then said neck transducer is selected to be the sustainer driver transducer by connecting it to said output of said sustainer amplifier,
  g. and wherein if said neck transducer is selected to provide said pickup amplifier input signal, then said bridge transducer is selected to be the sustainer driver transducer, wherein said bridge transducer is connected to said output of said sustainer amplifier,
  h. whereby said sustainer with said two low impedance electromagnetic transducers and said transducer selector will produce infinite sustain of the string vibrations of said instrument and also provide multiple pickup sounds at said instrument output as the functions of said low impedance electromagnetic transducers are changed from pickup to driver and vice-versa by said driver selector,
  i. and whereby said sustainer functions in a robust fashion when powered by a common 9-volt battery or other low-voltage power supply or battery because of said low impedance of said electromagnetic low impedance electromagnetic transducers.

15. The sustainer of claim 14,
  a. wherein said neck transducer is of the bilateral design, and wherein said bridge transducer is of the rail-type design, or vice-versa, wherein said bridge transducer is constructed as a common rail type, comprising two magnetic polepieces made of steel or other magnetic material, each said polepiece spanning across all the strings of said instrument, with said two polepieces disposed next to each other and wound with several hundred turns of wire, with a permanent magnet disposed such that the magnetic north-seeking pole of said magnet spans the entire length of one said polepiece and is attached to it, preferably disposed below said coil that is wound around said polepiece, and the magnetic south-seeking polepiece of said magnet spans the length of the other entire said polepiece, preferably positioned below said coil that is wound around the second said polepiece, such that both polepieces emanate magnetic fields that impinge on said instrument strings, attracting them toward said polepieces, with said wire coils connected preferably in parallel but not necessarily, polarized such that when a current of one polarity from said output of said sustainer amplifier passes through said coils, both said north and south seeking magnetic flux emanated by said polepieces toward said instrument strings increases in amplitude, and when an oppositely-polarized said current passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said rail type construction functions as a hum-cancelling pickup,
  b. and wherein a said second of said two low impedance electromagnetic transducers is of the bilateral type, also comprising two polepieces wound with wire, wherein each said polepiece is magnetized with a permanent magnet disposed preferably at the bottom of each said polepiece, one said polepiece being magnetized with north-seeking polarity, the other said polepiece being magnetized with south-seeking polarity, each said coil-polepiece assembly disposed approximately halfway across said span of instrument strings, such that one said polepiece radiates north-seeking magnetic flux toward approximately half of said strings, and the other said polepiece radiates south-seeking magnetic flux toward approximately the other half of said strings, wherein said coils are connected preferably in parallel, polarized such that when a current of one polarity passes through said coils, both said north and south seeking magnetic flux emanated by said polepieces toward said instrument strings increase in amplitude, and when a current of opposite polarity passes through said coils, both said north and south seeking magnetic flux emanated by said polepieces toward said instrument strings decrease in amplitude, resulting in both north and south seeking fields that pulsate in intensity when said parallel-connected coils are connected to said output of said transducer amplifier and receive said audio signal, and when connected as a pickup to said input of said pickup amplifier, said bilateral type construction functions as a hum-cancelling pickup.

* * * * *